US010582620B2

(12) United States Patent
Okura et al.

(10) Patent No.: US 10,582,620 B2
(45) Date of Patent: Mar. 3, 2020

(54) CONTROLLER

(71) Applicant: Mitsubishi Electric Corporation, Tokyo (JP)

(72) Inventors: Kenichiro Okura, Tokyo (JP); Shohei Yoshida, Tokyo (JP); Haruhiko Matoba, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/540,663

(22) PCT Filed: Jan. 19, 2015

(86) PCT No.: PCT/JP2015/051284
§ 371 (c)(1),
(2) Date: Jun. 29, 2017

(87) PCT Pub. No.: WO2016/117014
PCT Pub. Date: Jul. 28, 2016

(65) Prior Publication Data
US 2017/0354047 A1     Dec. 7, 2017

(51) Int. Cl.
*H05K 5/00* (2006.01)
*H05K 7/14* (2006.01)
(Continued)

(52) U.S. Cl.
CPC ........... *H05K 5/0017* (2013.01); *H05K 5/006* (2013.01); *H05K 5/0247* (2013.01); *H05K 5/03* (2013.01);
(Continued)

(58) Field of Classification Search
CPC ...... H05K 5/0017; H05K 5/03; H05K 7/1427; H05K 5/0247; H05K 5/006; H05K 2201/042; H05K 1/144
See application file for complete search history.

(56) References Cited

U.S. PATENT DOCUMENTS 4,542,437 A * 9/1985 Ellis .................. H02G 9/10
174/38
4,557,225 A * 12/1985 Sagues ............... F02D 41/3005
123/41.31
(Continued)

FOREIGN PATENT DOCUMENTS

JP        60-167380 U1    11/1985
JP        H05-62724 A      3/1993
(Continued)

OTHER PUBLICATIONS

International Search Report of the International Searching Authority dated Apr. 21, 2015 for the corresponding international application No. PCT/JP2015/051284 (and English translation).
(Continued)

*Primary Examiner* — Jinhee J Lee
*Assistant Examiner* — Theron S Milliser
(74) *Attorney, Agent, or Firm* — Posz Law Group, PLC

(57) ABSTRACT

A controller includes a control board, a transmitting board, a display board, and a USB board. A modular jack is arranged at a position on one surface of the transmitting board, the surface on which the modular jack is arranged faces the control board, and the position of the modular jack is not covered by the control board. A switch is arranged at a position on one surface of the control board, the surface on which the switch is arranged faces the display board and the USB board, and the position of the switch is not covered by the display board and the USB board.

13 Claims, 15 Drawing Sheets

(51) Int. Cl.
  *H05K 5/02* (2006.01)
  *H05K 5/03* (2006.01)
  *H05K 1/14* (2006.01)
(52) U.S. Cl.
  CPC ......... *H05K 7/1427* (2013.01); *H05K 7/1464* (2013.01); *H05K 1/144* (2013.01); *H05K 2201/042* (2013.01)

(56) References Cited

U.S. PATENT DOCUMENTS

| | | | | | |
|---|---|---|---|---|---|
| 4,801,828 | A | * | 1/1989 | Ishikawa | H03K 17/725 327/462 |
| 5,040,097 | A | * | 8/1991 | Stribel | B60R 16/0238 361/679.31 |
| 5,267,124 | A | * | 11/1993 | Ito | H05K 7/1432 361/785 |
| 5,504,655 | A | * | 4/1996 | Underwood | B60L 3/00 200/50.1 |
| 5,581,130 | A | * | 12/1996 | Boucheron | B60R 16/0238 307/10.1 |
| 5,677,830 | A | * | 10/1997 | Nogas | H05K 5/0021 361/732 |
| 5,825,618 | A | * | 10/1998 | Schnoor | H05K 5/0021 361/679.6 |
| 5,841,639 | A | * | 11/1998 | Schnoor | H05K 5/0021 361/796 |
| 6,015,302 | A | * | 1/2000 | Butts | B60R 16/0238 439/76.2 |
| 6,076,124 | A | * | 6/2000 | Korowitz | G05B 19/0423 361/679.4 |
| 6,522,550 | B1 | * | 2/2003 | Nishio | H05K 5/0021 361/679.4 |
| 6,721,630 | B1 | * | 4/2004 | Woytowitz | G05B 19/0421 239/69 |
| 6,891,463 | B2 | * | 5/2005 | Nagaoka | H01H 85/2035 337/187 |
| 6,923,660 | B2 | * | 8/2005 | Takeuchi | H01R 13/506 439/76.2 |
| 6,967,849 | B1 | * | 11/2005 | Hwang | H05K 5/0026 361/752 |
| 7,061,766 | B2 | * | 6/2006 | Wainwright | H05K 7/209 165/80.3 |
| 7,061,775 | B2 | * | 6/2006 | Beihoff | B60L 11/12 174/51 |
| 7,187,568 | B2 | * | 3/2007 | Radosevich | H02M 1/44 361/699 |
| 7,359,216 | B2 | * | 4/2008 | Hall | G06F 1/185 361/679.55 |
| 7,381,065 | B2 | * | 6/2008 | Ikeda | H05K 7/026 439/76.2 |
| 7,656,671 | B2 | * | 2/2010 | Liu | G06F 1/185 361/735 |
| 8,247,708 | B1 | * | 8/2012 | Ayres, III | H01R 13/5202 174/564 |
| 8,340,787 | B2 | * | 12/2012 | Yoshikawa | G06F 1/1601 700/17 |
| 8,583,843 | B2 | * | 11/2013 | Rosso | G06F 13/364 710/110 |
| 9,056,596 | B2 | * | 6/2015 | Nagashima | B60T 7/042 |
| 2005/0220443 | A1 | | 10/2005 | Nishida et al. | |
| 2005/0273205 | A1 | * | 12/2005 | Nickerson | A01G 25/16 700/284 |
| 2006/0030971 | A1 | * | 2/2006 | Nelson | A01G 25/165 700/284 |
| 2007/0246636 | A1 | * | 10/2007 | Katayama | B60L 11/12 248/637 |
| 2009/0251867 | A1 | * | 10/2009 | Sharma | H04Q 1/08 361/737 |
| 2010/0122841 | A1 | * | 5/2010 | Jang | H05K 1/14 174/260 |
| 2010/0165582 | A1 | * | 7/2010 | Hornkamp | H01L 23/053 361/740 |
| 2011/0019381 | A1 | * | 1/2011 | Kawano | H04B 3/54 361/783 |
| 2011/0310585 | A1 | * | 12/2011 | Suwa | H05K 7/20927 361/820 |
| 2013/0234636 | A1 | * | 9/2013 | Savatski | H02M 5/4585 318/400.26 |
| 2014/0084837 | A1 | * | 3/2014 | Tio | H02P 6/14 318/519 |
| 2015/0208524 | A1 | * | 7/2015 | Kontani | H05K 7/1432 361/752 |
| 2015/0282339 | A1 | * | 10/2015 | Bogen | H05K 1/0203 361/752 |
| 2015/0289391 | A1 | * | 10/2015 | Nakatsu | H05K 5/0026 361/796 |
| 2016/0037654 | A1 | * | 2/2016 | Kosuga | H02M 7/003 361/807 |
| 2016/0270268 | A1 | * | 9/2016 | Suzuki | H02M 7/003 |
| 2017/0194872 | A1 | * | 7/2017 | Fukumasu | H02M 7/003 |

FOREIGN PATENT DOCUMENTS

| | | |
|---|---|---|
| JP | 07-297561 A | 11/1995 |
| JP | 08-009653 A | 1/1996 |
| JP | 08-116680 A | 5/1996 |
| JP | H11-32412 A | 2/1999 |
| JP | H11-69774 A | 3/1999 |
| JP | 2000-059054 A | 2/2000 |
| JP | 2001-135202 A | 5/2001 |
| JP | 2002-064287 A | 2/2002 |
| JP | 3090085 U | 9/2002 |
| JP | 2005-295146 A | 10/2005 |
| JP | 2007-014095 A | 1/2007 |
| JP | 2011-216631 A | 10/2011 |

OTHER PUBLICATIONS

Office Action dated Jan. 16, 2018 issued in corresponding JP patent application No. 2016-570231 (and English translation thereof).

* cited by examiner

CONTROLLER

CROSS REFERENCE TO RELATED APPLICATION

This application is a U.S. national stage application of International Patent Application No. PCT/JP2015/051284 filed on Jan. 19, 2015, the disclosure of which is incorporated herein by reference.

TECHNICAL FIELD

The present disclosure relates to a controller.

BACKGROUND ART

A controller is provided for controlling an air conditioner installed in a facility such as a building. A single unit of such a controller, for example, is provided for each air conditioner. When multiple air conditioners coexist, multiple controllers are grouped and installed in a single control-unit control panel. In this case, space for installation of the controllers in the control panel is limited, and thus miniaturization of the controllers is required. A device in which printed circuit boards are overlapped and arranged is proposed in response to this requirement (for example, see Patent Literature 1). This device includes an opening for insertion and removal of the printer circuit board, and is configured to enable placement of the printed circuit board through the opening.

CITATION LIST

Patent Literature

Patent Literature 1: Unexamined Japanese Patent Application Kokai Publication No. 2002-64287

SUMMARY OF INVENTION

Technical Problem

However, switches for making fine adjustments and connectors for connecting local area network (LAN) cables for communication with an air conditioner are generally arranged on the board provided for the controller. The configuration described in Patent Literature 1 requires pulling the board out from the housing each time a switch is operated or a LAN cable is replaced. Maintenance of the controller cannot be efficiently performed when pulling out of the board is required in this manner.

Further, securing of space in the periphery of the controller is required in order to pull the board out. However, the securing of space is difficult when there are a large number of air conditioning units. In this case, an operation of removing the controller from the control panel is required in order to perform maintenance work on the controller, and this results in a lowering of work efficiency.

In consideration of the aforementioned circumstances, the objective of the present disclosure is to provide a controller that enables improved efficiency of maintenance work.

Solution to Problem

In order to attain the aforementioned objective, the controller of the present disclosure includes a plurality of circuit boards. One of the plurality of circuit boards includes at least one of a connector detachably attachable to a plug from an exterior of the controller, an electronic component comprising an operation part operable from the exterior, or a display part visible from the exterior disposed on a surface of the circuit board, a region of at least a portion of the surface faces the other circuit boards in a thickness direction of the circuit board, and the at least one of the connector, the electronic component, or the display part is disposed at a position on the circuit board not covered by the other circuit boards in the thickness direction of the circuit board.

Advantageous Effects of Invention

According to the present disclosure, the connector or the like arranged on the circuit board is disposed so that the connector or the like is not covered by another circuit board. By this means, a plug can be inserted in and removed from the connector, and the insertion and removal of the plug can be easily achieved while leaving the plurality of circuit boards in place, and thus maintenance work on the controller can be made more efficient.

DESCRIPTION OF EMBODIMENTS

Controllers according to various embodiments of the present disclosure are described below in reference to figures.

Figure 1:
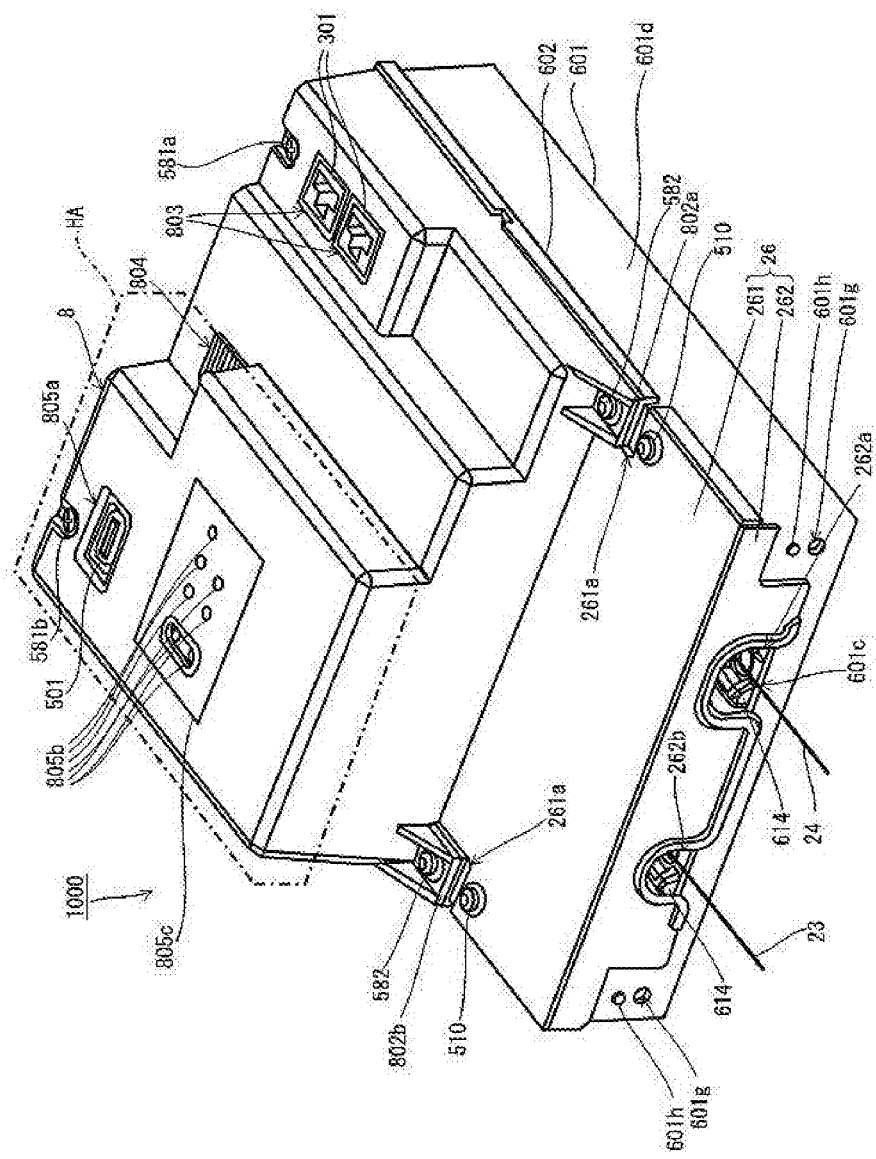
FIG. 1 is a tilted perspective view of a controller according to an embodiment of the present disclosure.

The controller according to the present embodiment, by exchanges of control signals with the air conditioner, controls operation of an air conditioner (not illustrated) installed in a facility such as a building and the like. As illustrated in FIG. 1, a controller 1000 includes a rectangular box-shaped housing 6 and an outer shell 8 that are arranged so as to cover one surface of the housing 6. A freely detachable-attachable lid 26 is attached to the housing 6. A portion of the outer shell 8 forms a gripping part HA that can be grasped by a user.

Figure 2:
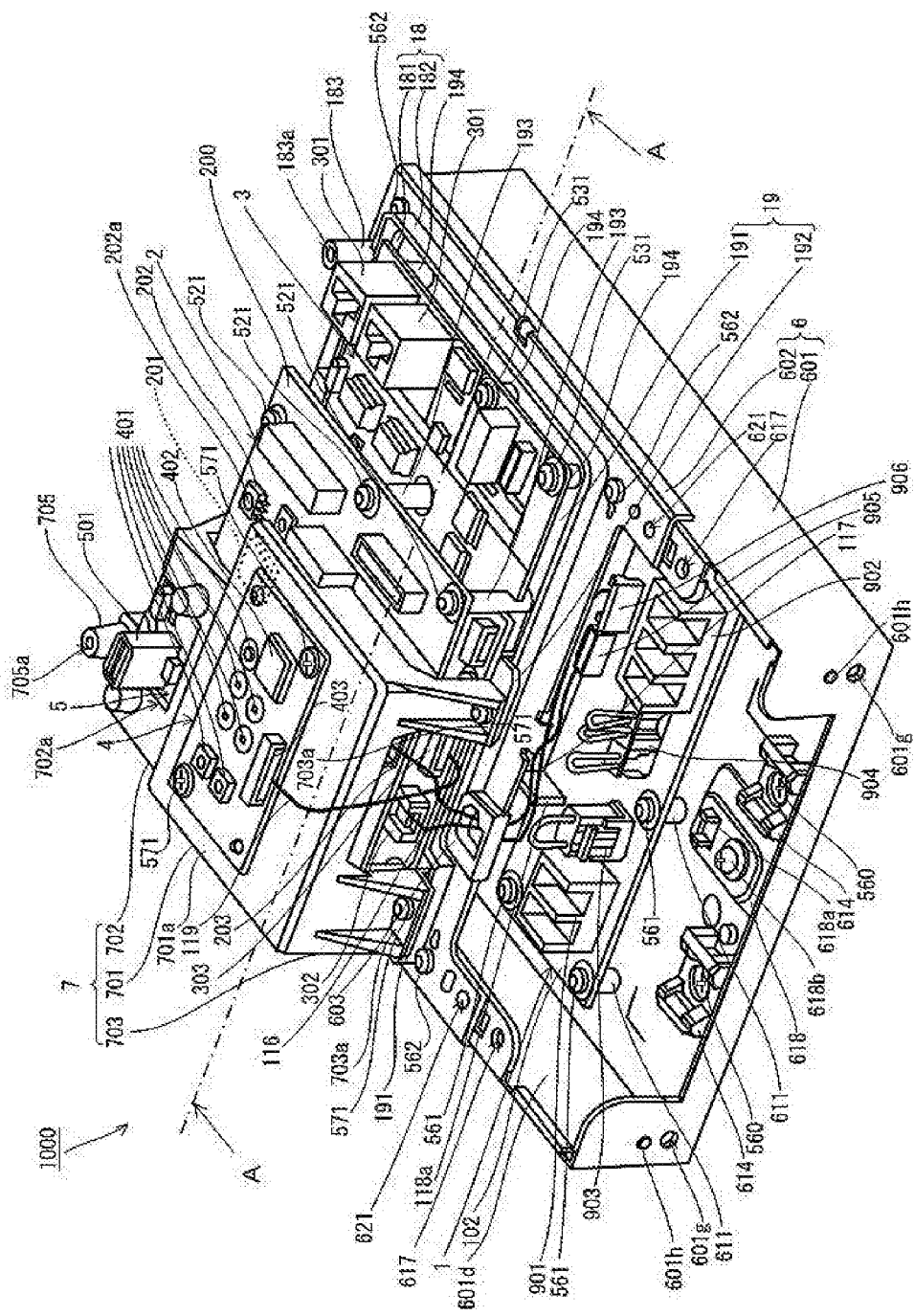
FIG. 2 is a tilted perspective view illustrating a state in which a lid and an outer shell are removed from the controller according to the embodiment.

As illustrated in FIG. 2, the controller 1000 includes a power supply board 1 for an output of DC power, a control board 2 for outputting a control signal, and a transmitting board 3 for exchanges of control signals between the control board 2 and the air conditioner. Further, the controller 1000 includes a display board 4 for display of an operational status of the air conditioner and a universal serial bus (USB) board 5 including a USB connection part 501 for connection of a USB cable (not illustrated).

The power supply board 1 is enclosed by the flat-rectangular-shaped housing 6. The control board 2 and the transmitting board 3 are arranged to the exterior of the housing 6. The control board 2 is arranged at a position that overlaps the transmitting board 3 in the thickness direction of the control board 2. The control board 2 and the transmitting board 3 are connected in common to a grounding member 19. The display board 4 and the USB board 5 are arranged at positions that overlap the control board 2 in the thickness direction of the display board 4 and the USB board 5. The display board 4 and the USB board 5 are held by a holding member 7. An insulating member 18 is interposed between the grounding member 19 and the housing 6.

Figure 3:
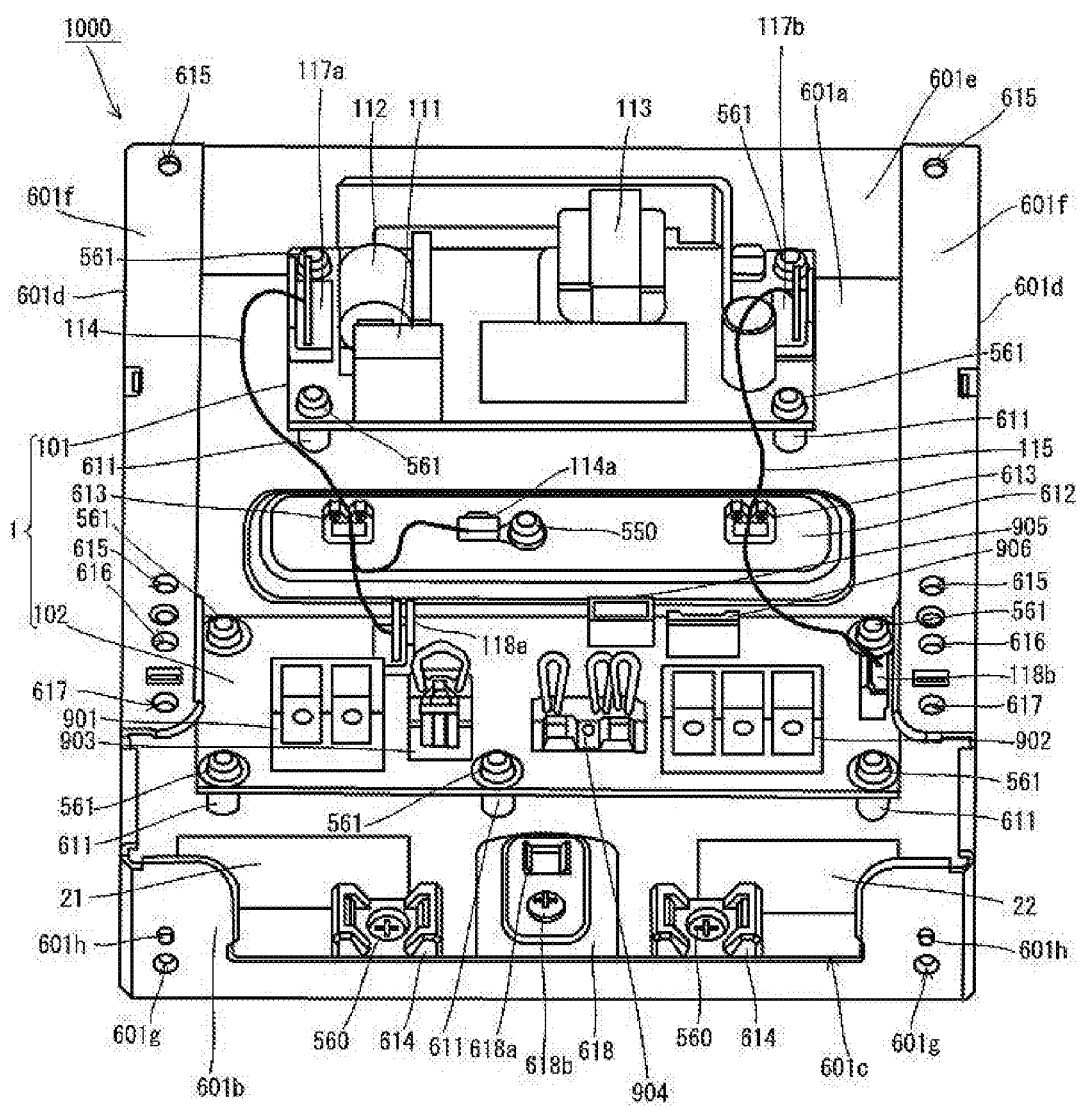
FIG. 3 is a tilted perspective view illustrating a housing and a power supply board of the controller according to the embodiment.

The power supply board 1 is a circuit board forming a power supply circuit to convert AC power supplied, for example, from an external commercial power supply (not illustrated) or the like to DC power. As illustrated in FIG. 3, the power supply board 1 includes a main body board 101 and a terminal board 102. The main body board 101 and the terminal board 102 are both rectangle-shaped and are arranged inside the housing 6.

The main body board 101 includes a rectangle-shaped printed circuit board and a rectifying element 111, a capacitor 112, an isolation transformer 113, and the like arranged on the printed circuit board. On the main body board 101, voltage of alternating current supplied to the primary side of the isolation transformer 113 is lowered, and the lowered voltage is output to the rectifying element 111 connected to the secondary side. Pulsed current output from the rectifying element 111 is smoothed by the capacitor 112. The main body board 101 further includes a first main body-side connection part 117a to connect a wire harness 114 thereto for supply of AC power and a second main body-side connection part 117b to connect a wire harness 115 thereto for supply of DC power. Here, the wire harness 114 bundles three conductive wires. Further, the wire harness 115 is formed from a single conductive wire.

The terminal board 102 includes terminals connected to a device exterior to the housing 6 or to the control board 2, the transmitting board 3, the display board 4, and the USB board 5, and includes multiple terminals connecting via a transmitting cable 24 to the air conditioner. The terminal board 102 includes a rectangular plate-shaped printed circuit board and various terminals arranged on the printed circuit board. The terminal board 102 is positioned such that an edge opposite to the main body board 101 in the transverse direction of the terminal board 102 is accessible from the exterior of the housing 6 when the lid 26 is removed. A power supply connecting terminal 901 for connecting a power supply cable 23 and a transmission connecting terminal 902 for connecting the transmitting cable 24 are arranged on the terminal board 102. The terminal board 102 further includes a connector 903 for inspection that is used during a product inspection process and the like, and a connector 904 for servicing that is used during servicing in the marketplace and the like. The power supply connecting terminal 901, the transmission connecting terminal 902, the connector for inspection 903, and the connector 904 for servicing are arranged along the aforementioned edge of the terminal board 102. That is to say, terminals for external connection requiring access from the exterior of the housing 6 are arranged on the aforementioned edge of the terminal board 102. Further, a first supplying terminal 905 for supplying AC power to the control board 2 and a second supplying terminal 906 for supplying DC power to the transmitting board 3 are arranged on the terminal board 102. The first supplying terminal 905 and the second supplying terminal 906 are terminals for internal connections that do not required access from the exterior of the housing 6, and are arranged along a main body board 101-side edge in the transverse direction of the terminal board 102. The terminal board 102 includes a first terminal-side connection part 118a to which the wire harness 114 (power supply line) connects and a second terminal-side connection part 118b to which the wire harness (power supply line) 115 connects. The wire harness 114 is a power supply line for supplying AC power to the main body board 101, and the wire harness 115 is a power supply line for supplying DC power to the terminal board 102. The main body board 101 and the terminal board 102 are connected electrically via the wire harness 114 and the wire harness 115.

Again in reference to FIG. 2, the control board (circuit board) 2 includes control circuits for generating and outputting to the transmitting board 3 a control signal for air conditioner control, and for processing of a control signal input from the transmitting board 3. More specifically, the control board 2 includes a rectangle-shaped printed circuit board and circuit components including a microcomputer 201 and a switch 202 arranged on this printed circuit board. The switch 202 is formed from a switch such as a toggle switch. The switch 202 can be operated by use of an operation part 202a from a direction intersecting the surface of the control board 2 on which the switch 202 is arranged. Further, a power receiving part 203 is arranged on the control board 2 for receiving the DC power supplied from the power supply board 1 and for supplying DC power to the circuit components. The switch 202 is an electronic component that has the operation part 202a for operation from a direction perpendicular to one surface of the control board 2. For receiving driving power, the power receiving part 203 is electrically connected via the wire harness 116 for supplying power to the first supplying terminal 905 arranged on the terminal board 102. The microcomputer 201 operates using power received by the power receiving part 203 from the power supply board 1. The switch 202 is disposed such that the operation part 202a faces outwardly. That is to say, the control board 2 is disposed such that the surface on which the switch 202 is disposed faces away from the housing 6. The control board 2 is positioned such that an area of one surface, in the thickness direction of the control board 2, is facing the display board 4 and the USB board 5, and such that, for visibility of the switch 202 from the exterior, the one surface is not covered by the display board 4 and the USB board 5.

The transmitting board (circuit board) 3 includes a transmission circuit for transmitting and receiving control signals of the air conditioner sent between the control circuit and the air conditioner. More specifically, the transmitting board 3 includes a rectangle-shaped printed circuit board and circuit components, including modular jacks 301, arranged on the printed circuit board. The transmission circuit includes, for example, a modem (not illustrated) and a gateway (not illustrated). A power receiving part 302 for receiving DC power supplied from the power supply circuit and for supplying DC power to the circuit components, and a transmitting part 303 for transmitting control signals to the display board 4, are disposed on the transmitting board 3. The modular jacks 301 are connectors for detachable attachment of plugs of a local area network (LAN) cable from the exterior of the outer shell 8. The modular jacks 301 are capable of attachment to and detachment from the plug from a direction that intersects with the surface of the transmitting board 3 on which the modular jacks 301 are disposed. In order to receive driving power, the power receiving part 302 is electrically connected, via a wire harness 117 for supplying power, to the second supplying terminal 906 arranged on the terminal board 102. The modem and gateway are driven by power received by the power receiving part 302 from the power supply board 1. The transmitting board 3 is disposed such that the surface on which the modular jacks 301 are arranged faces outwardly. That is to say, the transmitting board 3 is disposed such that the surface on which the modular jacks 301 are arranged faces away from the housing 6. Further, the transmitting board 3 is disposed such that one portion of a region of one surface of the transmitting board 3 faces the control board 2 in the transmitting board 3 thickness direction, and the modular jacks 301 are positioned so that the modular jacks 301 are not covered by the control board 2 are viewable from the exterior. In the state in which the outer shell 8 is removed, each of the switch 202 and the modular jacks 301 is visible from the exterior.

The display board (circuit board) 4 is provided with a display circuit that includes light emitting parts 401. More specifically, the display board 4 is formed from a rectangle-shaped printed circuit board and various types of components arranged on the printed circuit board. A driver 402 that controls the lighting state of the light emitting parts 401 by a control signal sent, for example, from a control circuit, and a receiving part 403 for receiving the control signal from the control circuit, are arranged on the display board 4. In the vicinity of two corner portions of the display board 4 opposing each other with the center of the display board 4 sandwiched therebetween, through holes (not illustrated) pass entirely through the thickness direction of the display board 4 for insertion of screws 571. The light emitting parts 401 include components such as LED lamps and are display parts that are visible from the exterior. The receiving part 403 is connected via the wire harness 119, which is a display signal line, to the transmitting part 303 arranged on the transmitting board 3. The control signal used for lighting control of the light emitting parts 401 is transmitted from the control circuit via a transmission circuit to the receiving part 403 of the display circuit. The receiving part 403 inputs the received control signal to the driver 402.

The USB board (circuit board) 5 includes a USB transmission circuit that exchanges signals between the control board 2 and an electronic device (not illustrated) connected to the USB connection part 501. The USB board 5 includes a rectangle-shaped printed circuit board and various types of components arranged on the printed circuit board. In the vicinity of two corner portions of the USB board 5 opposing each other with the center of the USB board 5 sandwiched therebetween, through holes (not illustrated) penetrate through the USB board 5 in the thickness direction thereof for insertion of screws (not illustrated).

As a result, the surface of the terminal board 102 on which the terminals for exterior connection are arranged, the surface of the control board 2 on which the switch 202 is arranged, and the surface of the transmitting board 3 on which the modular jacks 301 are arranged all face in the same direction. Further, the surface of the display board 4 on which the light emitting parts 401 are arranged and the surface of the USB board 5 on which the USB connection part 501 is arranged face the same direction as the surface of the control board 2 on which the switch 202 is arranged.

Figure 4:
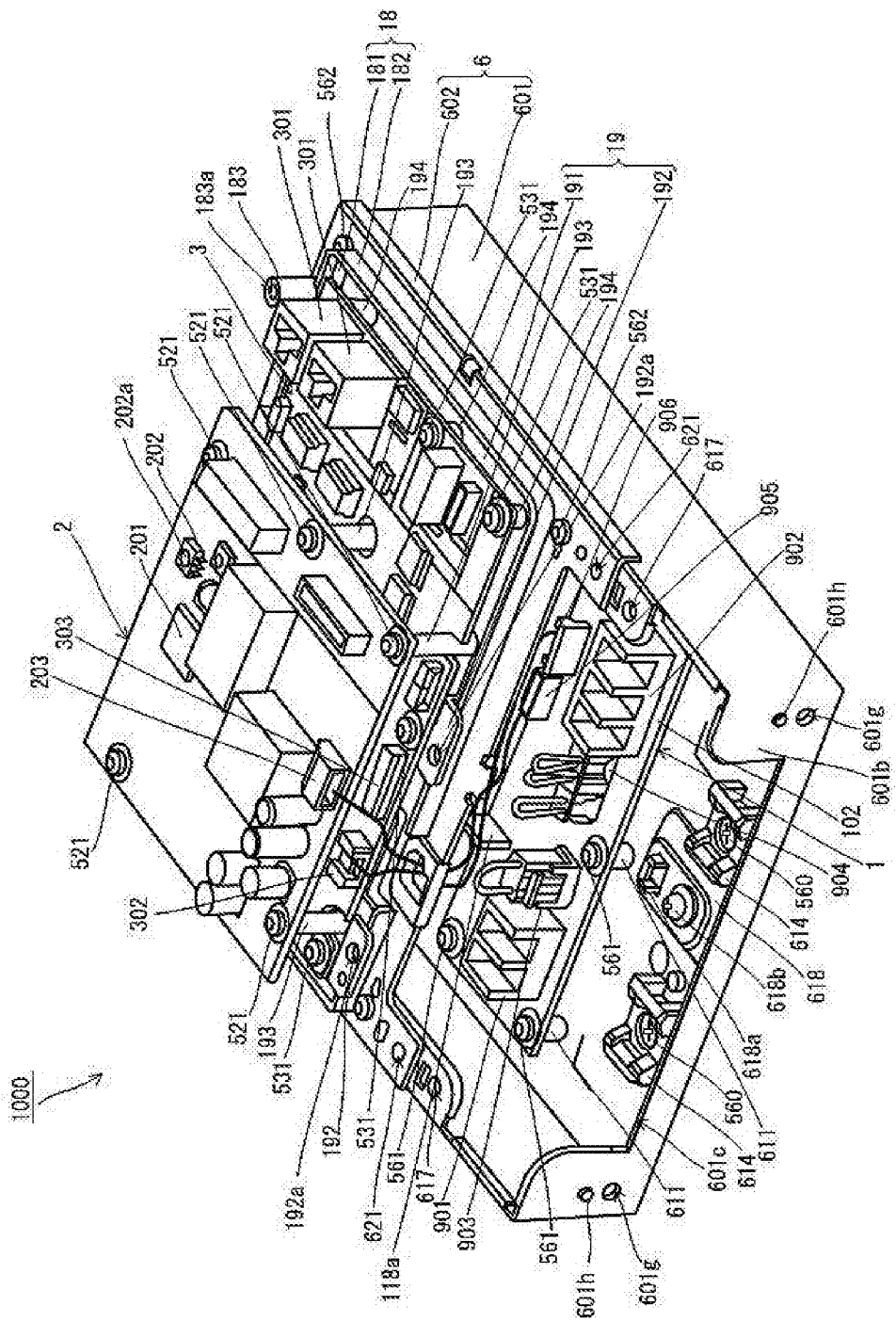
FIG. 4 is a tilted perspective view illustrating a state in which the lid, the outer shell, and a holding member are removed from the controller according to the embodiment.

The grounding member 19 is formed from a conductive material such as a metal. The grounding member 19 is provided with a rectangle-shaped main piece 191 and fixing pieces 192 to which holding members 7 are fixed, the fixing pieces 192 extending from a plurality of locations, for example, from 4 locations, at the periphery of the main piece 191. First connection parts 193 electrically connected to the control board 2 and second connection parts 194 electrically connected to the transmitting board 3 are integrally arranged standing on the grounding member 19. The first connection parts 193 and the second connection parts 194 are formed or an electrically conductive material such as metal. A screw hole (not illustrated) is bored into each of the distal tips of the first connection parts 193 and the second connection parts 194. Through holes (not illustrated) are arranged in multiple sections (five sections in FIG. 4) corresponding to the first connection parts 193 of the control board 2, and land portions (not illustrated) electrically connected to a grounding line are formed at the outer peripheral portions of these through holes. As illustrated in FIG. 4, the control board 2 is fixed to the distal end portions of the first connection parts 193 by metallic screws 521 inserted through each of the through holes and screwed into the screw holes of the first connection parts 193. By this means, the land portions of the control board 2 are electrically connected to the grounding member 19 via the screws 521 and the first connection parts 193. In a plurality of sections corresponding to the second connection parts 194 at the peripheral portion of the transmitting board 3, through holes (not illustrated) are arranged, and land portions (not illustrated) connected electrically to the grounding line of the transmitting board 3 are formed. The transmitting board 3 is fixed to the distal end portions of the second connection parts 194 by metallic screws 531 inserted through each of the through holes and screwed into the screw holes of the second connection parts 194. By this means, the land portions of the transmitting board 3 are electrically connected to the grounding member 19 via the screws 531 and the second connection parts 194.

Figure 5:
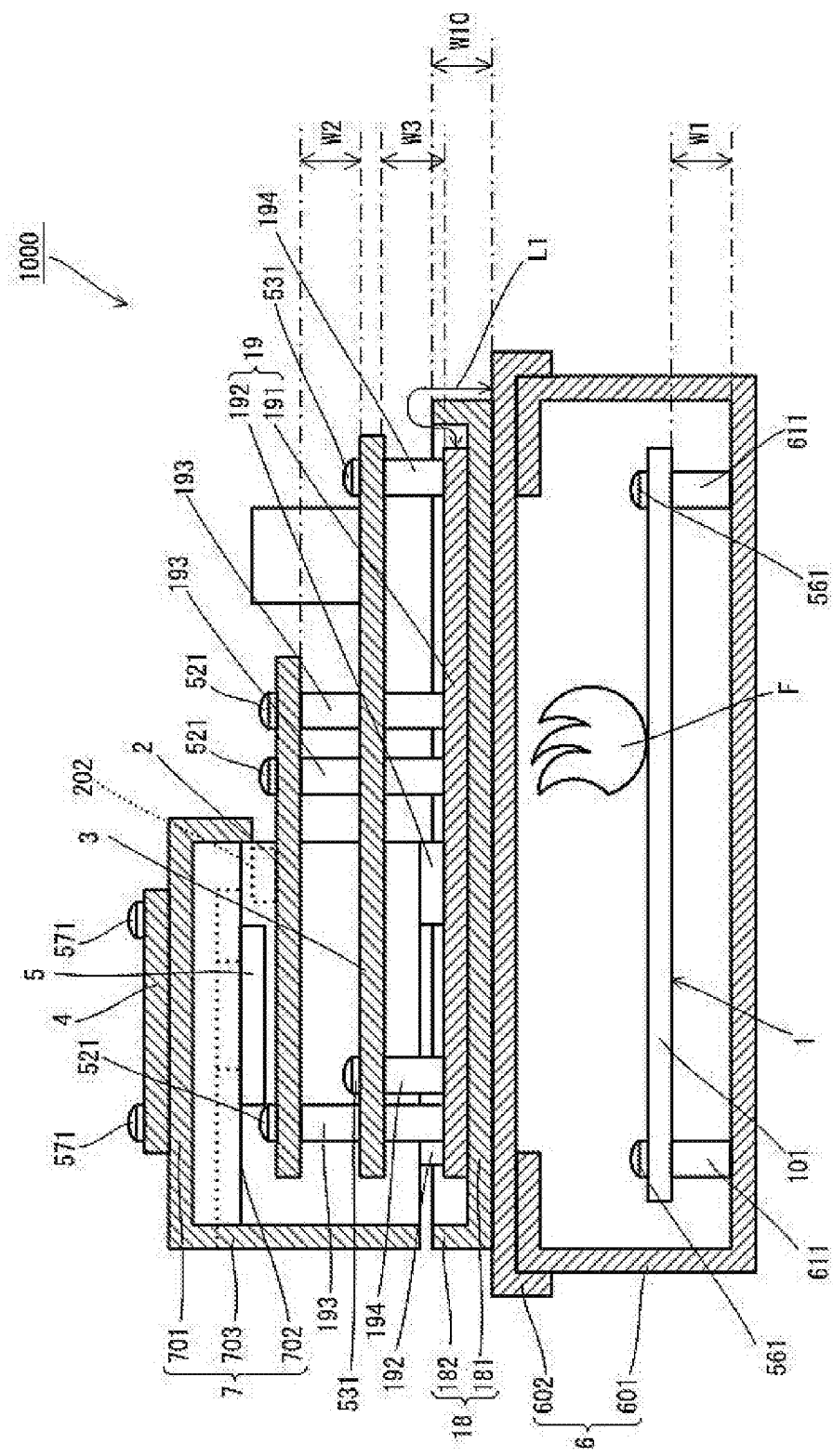
FIG. 5 is a drawing of the controller of the embodiment, as viewed in a cross section taken along the line A-A of FIG. 2 and looking in the direction of the arrow.

As illustrated in FIG. 5, which is a cross-sectional drawing taken along A-A of FIG. 2 and as viewed in the arrow direction, the control board 2 is arranged at a position that is far from a lid part 602 in comparison to the transmitting board 3. In response to this arrangement, length of the first connection parts 193 connecting to the control board 2 is set longer than the length of the second connection parts 194 connecting to the transmitting board 3. Further, illustration of various types of connectors and electronic components and the like arranged on the power supply board 1, the control board 2, the transmitting board 3, the display board 4, and the USB board 5, as well as the outer shell 8, is omitted from FIG. 5. A distance W3 between the transmitting board 3 and the main piece 191 of the grounding member 19, a distance W2 between the control board 2 and the transmitting board 3, and a distance W1 between the power supply board 1 and a bottom wall 601*a* of the housing 6 are determined by safety standards and the like such as, for example, IEC 60950. Table 2H of IEC 60950 sets minimum standard values of spacing distance on the basis of factors such as voltage of the power supply board 1 AC main power supply voltage, and the amount of contamination from dust and the like.

The holding member 7 is disposed so as to straddle between the control board 2 and the transmitting board 3, and holds the display board 4 and the USB board 5 such that the display board 4 and the USB board 5 are positioned to overlap the control board 2 as viewed from the thickness direction of the control board 2. The holding member 7 is fixed by the screws 571 to the fixing piece 192 of the grounding member 19. The display board 4 and the USB board 5 are electrically connected via the holding member 7 to the grounding member 19 by this means. The holding member 7 is formed from an electrically conductive material such as metal. As illustrated in FIG. 2, a rectangle-shaped (in top view) first section 701 having an attachment surface 701*a* for attachment of the display board 4, a rectangle-shaped (in top view) second section 702 adjacent to the first section 701 and having a window part 702*a* attached to the USB board 5, and a supporting part 703 supporting the first section 701 and the second section 702 are provided in the holding member 7. Further, the holding member 7 includes a rib 705, extending in the thickness direction of the second section 702 and integrally formed with the second section 702, for support of the outer shell 8. A fixing piece 703*a* is arranged in the supporting part 703 for fixing of the holding member 7 to the grounding member 19. A screw hole 705*a* engaging a screw 581*b* (see FIG. 1) is bored in the distal end portion of the rib 705.

The display board 4 is fixed to the attachment surface 701*a* of the first section 701 by fastening by the screw 571. The USB board 5 is fixed by screwing in a state in which the peripheral portion of the USB board 5 contacts the lower surface of the second section 702, and electronic components, such as the USB connection part 501, are exposed through the window part 702*a*.

Figure 6:
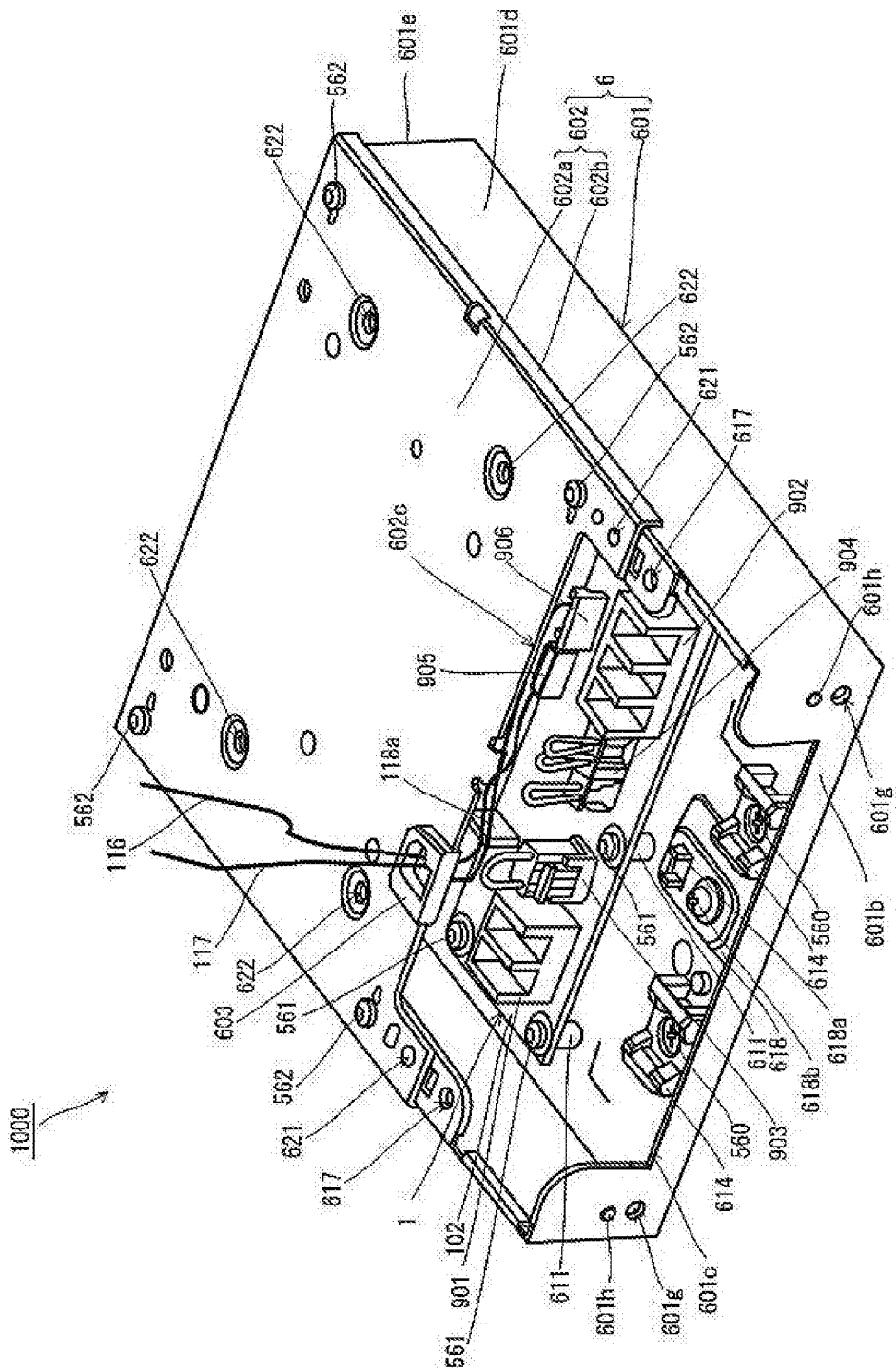
FIG. 6 is a tilted perspective view illustrating the housing and the power supply board of the controller according to the embodiment.

As illustrated in FIG. 6, the housing 6 is formed from a main body part 601 that is roughly flat rectangle-box-shaped and that has one surface open in the thickness direction, and the lid part 602 arranged so as to cover a portion of the open portion of the main body part 601. In a sidewall 601*b* that surrounds the section in the main body part 601 uncovered by the lid part 602, a cutout part 601*c* is formed to allow insertion of the power supply cable 23 and the transmitting cable 24. The main body part 601 and the lid part 602 are each formed of a fire-resistant material such as a metal material. Aluminum and the like are cited as examples of the metal material. The main body part 601 and the lid part 602 are formed, for example, by plate metal processing of a plate-like member formed from the metal material.

As illustrated in FIG. 3, the main body board 101 is disposed at one end side covered by the lid part 602 in the lengthwise direction of the main body part 601. The terminal board 102 is arranged at the other end side in the lengthwise direction of the main body part 601. The main body board 101 and the terminal board 102 are fastened by screwing with separation via spacers 611 from the bottom wall 601*a* of the main body part 601. In the bottom wall 601*a* of the main body part 601, a projecting base part 612 is formed projecting to the interior side of the main body part 601 between the region of attachment of the main body board 101 and the region of attachment of the terminal board 102.

The projecting base part 612 is formed integrally with the bottom wall 601*a*. Bundling members 613 that bundle the wire harness 114 and the wire harness 115 are arranged in the projecting base part 612. Thus the positions of the wire harnesses 114 and 115 can be fixed within the main body part 601, and the wire harnesses 114 and 115 can be prevented from interfering with components arranged on the main body board 101 and the terminal board 102 and the like. Screw holes (not illustrated) are bored in the projecting base part 612, and the grounding terminal 114*a* of the wire harness 114 is fixed to the projecting base part 612 by screws 550 screwed into these screw holes. The main body board 101 and the terminal board 102 are grounded by this means. A section of the terminal board 102 in which the power supply connecting terminal 901, the transmission connecting terminal 902, the connector for inspection 903, and the connector 904 for servicing are arranged is disposed at a position uncovered by the lid part 602 within the housing 6.

In the vicinity of the bottom wall 601*a* and the sidewall 601*b*, fixing bases 614 are arranged for fixing each of the power supply cable 23 and the transmitting cable 24 (see FIG. 1). The fixing bases 614 are fixed to the main body part 601 by screws 560 screwing into screw holes (not illustrated) bored into the bottom wall 601*a*. Further, between the two fixing bases 614, a grounding terminal base 618 is arranged that is formed integrally with the bottom wall 601*a* and that has a sandwiching part 618*a* that sandwiches a below-described grounding plug 23*b* (see FIG. 12). The grounding plug 23*b* is fixed by screwing to the grounding terminal base 618 using a screw 618*b*. Between the power supply connecting terminal 901 of the bottom wall 601*a* and the fixing base 614, a display label 21 is attached, on which are printed character strings and the like (not illustrated) indicating the targets of connection of the power supply cable terminals. Between the transmission connecting terminal 902 of the bottom wall 601*a* and the fixing base 614, a display label 22 is attached, on which are printed character strings and the like (not illustrated) indicating the targets of connection of the transmission cable terminals.

In edges of sidewalls 601*d* arranged mutually parallel to the main body part 601, extending pieces 601*f* are arranged that extend in the direction, roughly parallel to the bottom wall 601*a*, of mutual approach of the extending pieces 601*f*. The extending pieces 601*f* are positioned in sections covered by the lid part 602 of each sidewall 601*d*. Screw holes 615 for attachment of the lid part 602, screw holes 616 for fixing of the outer shell 8, and screw holes 617 for attachment of the lid 26 to the housing 6 are bored in each of the extending pieces 601*f*. Screw holes 601*g* for attachment of a below-described attaching member 27 (see FIG. 10) are bored in each of the sidewall 601*b* of the main body part 601 and a sidewall 601*e*, which is disposed opposing the sidewall 601*b*. Further, a projecting part 601*h* for positioning of the attachment member 27 is arranged projecting in the vicinity of the screw holes 601*g* in the sidewalls 601*b* and 601*e*.

As illustrated in FIG. 6, the lid part 602 has an approximately rectangular shape. The lid part 602 is provided with: a main piece 602*a* having a rectangle-shaped (top view) cutout part 602*c* formed in one side of the lid part 602, and side pieces 602*b* extending in one direction orthogonal to the main piece 602*a* from the three sides other than the side in which the cutout part 602*c* is formed in the main piece 602*a*. The lid part 602 is disposed in a state in which the inner surfaces of the side pieces 602*b* contact the outer surfaces of the sidewall 601*d* and the sidewall 601*e* of the main body part 601. Four through holes (not illustrated) are arranged penetrating the lid part 602 in the thickness direction thereof in the vicinities of the four corner portions of the main piece 602a. The lid part 602 is fixed to the main body part 601 by screwing attachment of screws 562 inserted through these through holes into screw holes 615 (see FIG. 3) bored in the extending pieces 601f of the main body part 601. Further, a ring-shaped bundling member 603 is attached to the outer peripheral portion of the cutout part 602c in the main piece 602a for bundling of the wire harness 116 and the wire harness 117. The bundling member 603 is formed, for example, from a plastic material that is electrically insulating. The wire harness 116 is connected (see FIG. 2) to the power receiving part 203 of the control board 2 via the bundling member 603 from the first supplying terminal 905 arranged on the terminal board 102. The wire harness 117 is connected (see FIG. 2) to the power receiving part 302 of the transmitting board 3 via the bundling member 603 from the second supplying terminal 906 arranged on the terminal board 102. In the lid part 602, through holes 621 are arranged, penetrating in the thickness direction of the lid part 602, through which screws 582 (see FIG. 1) are inserted in order to fix the outer shell 8 to the housing 6. Further, holes 622 are bored in the lid part 602 for fixing of the insulating member 18 to the lid part 602.

The lid part 602 is formed by processing of plate metal, and thus damage may occur to the covering of the wire harnesses 116 and 117 when there is direct contact between the wire harnesses 116 and 117 and the peripheral edge portion of the cutout part 602c. To prevent such damage, in the present embodiment, the wire harnesses 116 and 117 are arranged to pass through the bundling member 603, which is made of resin. Thus contact between the wire harnesses 116 and 117 and the peripheral edge portion of the cutout part 602c can be suppressed, and damage to the covering of the wire harnesses 116 and 117 can be suppressed.

Again in reference to FIG. 1, the lid 26 is provided with an approximately rectangular main piece 261, and a side piece 262 extending in one direction roughly orthogonal to the main piece 261 and continuing to the main piece 261 at one end side in the transverse direction of the main piece 261. The lid 26 is formed from a flame-resistance material such as a metal and the like. Aluminum and the like may be cited as examples of the metal material. The main piece 261 is disposed so as to cover, among the open portion of the main body part 601 of the housing 6, the portion unshielded by the lid part 602. The side piece 262 is disposed so as to cover the cutout part 601c of the sidewall 601b. A cutout part 261a is formed in the main piece 261 at both end portions in the lengthwise direction of the main piece 261 at another end side in the transverse direction. In the vicinity of each of the cutout parts 261a, through holes (not illustrated) are arranged in the main piece 261 for insertion of screws 510 for attachment of the lid 26 to the housing 6. By screwing of the screws 510 passing through these holes into the screw holes 617 of the main body part 601 of the housing 6, the lid 26 is attached to the housing 6. Cutout parts 262a and 262b are formed in the side piece 262 for allowing insertion and passing of the power supply cable 23 and the transmitting cable 24. Size of the cutout part 262b is larger than size of the cutout part 262a. The lid 26 is removed from the housing 6 by removal of the screws 510 during work to remove and reattach the power supply cable 23 and the transmitting cable 24.

The insulating member 18 is a member interposed between the grounding member 19 and the housing 6 for electrical insulation between the grounding member 19 and the housing 6. This insulating member 18 is formed, for example, from a resin material that is electrically insulating, such as polycarbonate resin, ABS resin, and the like. As illustrated in FIG. 4, the insulating member 18 is provided with a bottom wall 181, a sidewall 182 extending in the thickness direction from the peripheral portion of the bottom wall 181, and a rib 183 extending in the thickness direction of the bottom wall 181 and formed integrally with the sidewall 182. The insulating member 18 is attached to the lid part 602 in a state in which the bottom wall 181 contacts the surface of the lid part 602. Engaging parts (not illustrated) are arranged in the lid part 602 of the insulating member 18 to engage with the holes 622 (see FIG. 6) arranged in the lid part 602. The insulting member 18 is fixed to the lid part 602 in a state in which the engaging parts engage with the holes 622. The grounding member 19 is disposed above the bottom wall 181 of the insulating member 18. A screw hole 183a, into which a screw 581a screws, is bored in the distal tip portion of the rib 183 (see FIG. 1).

As illustrated in FIG. 5, the grounding line of the control board 2 and the transmitting board 3 is electrically connected to the grounding member 19 via the first connection parts 193 and the second connection parts 194. On the other hand, the grounding line of the power supply board 1 is electrically connected to the housing 6 by fixing of the grounding terminal 114a by the screw 550 to the housing 6. Further, the grounding member 19 and the housing 6 are electrically insulated from each other by the insulating member 18 interposed between the grounding member 19 and the housing 6. In this manner, the grounding member 19 electrically connected to the grounding lines of the control board 2 and the transmitting board 3, through which relatively little current flows, is electrically insulated by the insulating member 18 from the housing 6 that electrically connects to the grounding line of the power supply board 1 through which a relatively large current flows. Further, the insulating member 18 is provided with the sidewall 182. By this means, creepage distance L1 between the grounding member 19 and the lid part 602 of the housing 6 can be increased, and thus insulation between the housing 6 and the grounding member 19 can be made more certain than in a configuration in which the sidewall 182 does not exist. Further, safety standards and the like regulate the creepage distance L1. For example, in Table 2L of IEC 60950, the minimum standard value of the creepage distance L1 is determined on the basis of factors such as maximum standard voltage, insulation material, and the amount of contamination from dust and the like.

Figure 7:
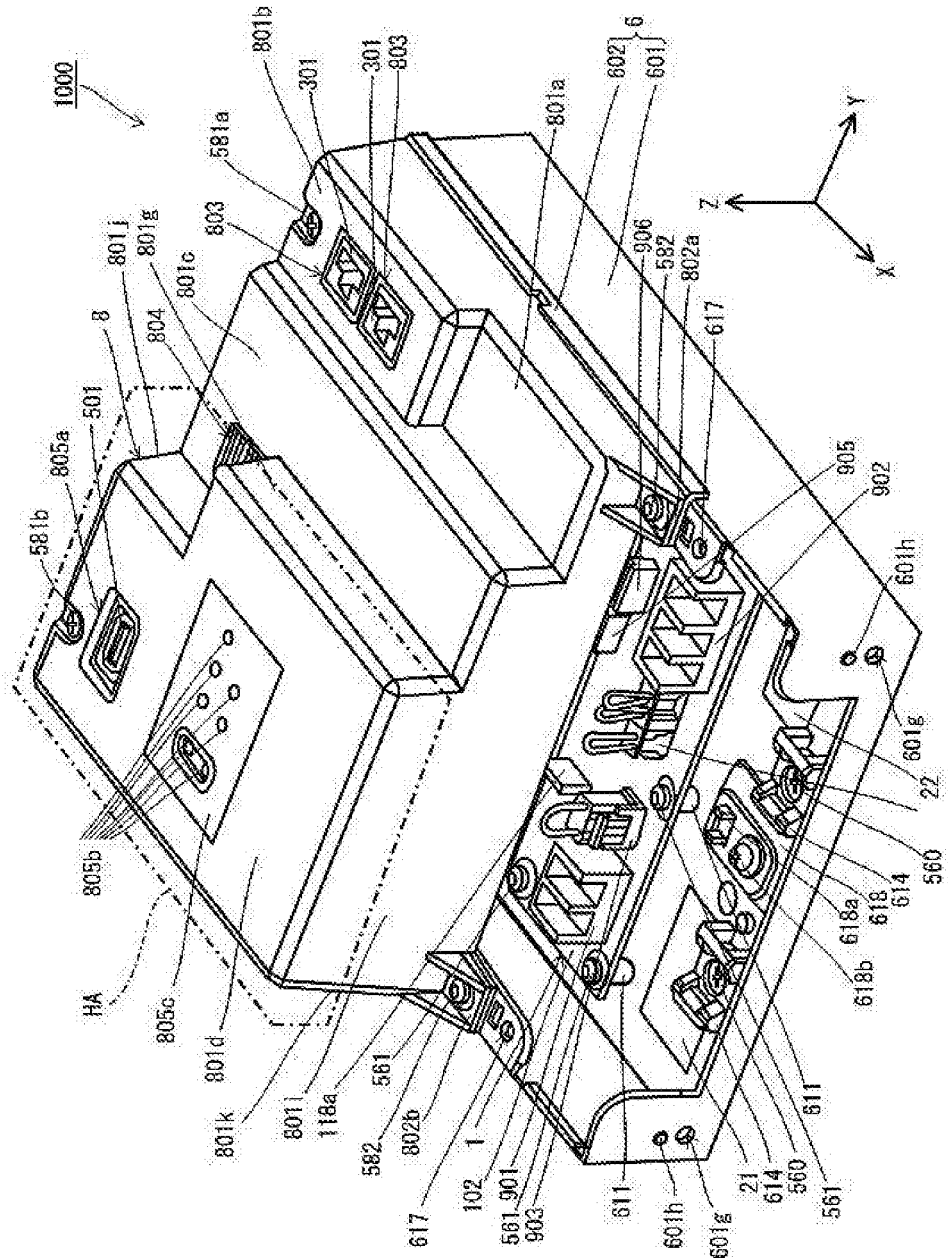
FIG. 7 is a tilted perspective view illustrating a state in which the lid is removed from the controller according to the embodiment.

As illustrated in FIG. 7, the outer shell 8 is box-shaped, has one open face, and is disposed so as to cover the control board 2, the transmitting board 3, the display board 4, and the USB board 5 from the open face side. The outer shell 8, in a portion thereof, has the gripping part HA for use when the user to grips by hand the controller 1000, and the display board 4 and the USB board 5 are disposed to the inside of the gripping part HA. In the aforementioned manner, the control board 2, the transmitting board 3, the display board 4, and the USB board 5 overlap in the thickness direction of each of the boards. Further, the transmitting board 3 is disposed so that the modular jacks 301 are covered by the control board 2, and the control board 2 is disposed at a position such that the switch 202 is not covered by the display board 4 and the USB board 5. As a result, the control board 2, the transmitting board 3, the display board 4, and the USB board 5 are disposed such that step differences occur in the lateral directions of the boards (for example, see FIG. 5). The outer shell 8 has a stepped shape that reflects this disposal of the control board 2, the transmitting board 3, the display board 4, and the USB board 5. The outer shell 8 is provided with a rectangle-shaped (top view) first bottom wall 801a, a second bottom wall 801b, a third bottom wall 801c, and a fourth bottom wall 801d. The second bottom wall 801b is separated from the open face in a direction (+Z direction in FIG. 7) further than the first bottom wall 801a. The third bottom wall 801c is separated from the open face in a direction (+Z direction in FIG. 7) yet further than the second bottom wall 801b. The fourth bottom wall 801d is separated from the open face in a direction (+Z direction in FIG. 7) yet even further than the third bottom wall 801c.

The gripping part HA includes, in the outer shell 8, the fourth bottom wall 801d as well as sections adjacent to a sidewall 801g and sidewalls 801i, 801j, and 801k that are each located by the fourth bottom wall 801d. Tongue parts 802a and 802b are formed in the lid part 602 side edge portion of the sidewall 801i. Through holes (not illustrated), through which the screws 582 are inserted for fixing the outer shell 8 to the lid part 602, are arranged in the tongue parts 802a and 802b. In the edge portion of the second bottom wall 801b, a through hole (not illustrated) through which a screw 581a is inserted is arranged for fixing the outer shell 8 to the insulating member 18. In the edge portion of the fourth bottom wall 801d, a through hole (not illustrated), through which the screw 581b is inserted, is also arranged for fixing the outer shell 8 to the holding member 7. The outer shell 8 is fixed to the housing 6 by screwing of the screws 582 inserted in the through holes formed in the tongue parts 802a and 802b, the screw 582 inserted in the through hole 621, and the screw hole 616 (see FIG. 3) of the main body part 601. Further, the outer shell 8 is fixed to the insulating member 18 and the holding member 7 by screwing of the screws 581a and 581b inserted in the through holes formed in the first bottom wall 801a and the fourth bottom wall 801d into the screw holes 183a and 705a of the ribs 183 and 705.

Openings 803 for exposing to the exterior of the outer shell 8 the modular jacks 301, and an opening 804 for accessing the switch 202 from the outer shell 8, are arranged in the outer shell 8. The openings 803 are arranged in sections of the outer shell 8 that overlap the modular jacks 301 in the thickness direction of the transmitting board 3. The opening 804 is arranged in a section of the outer shell 8 that overlaps the switch 202 in the thickness direction of the control board 2. Specifically, the openings 803 are arranged in the second bottom wall 801b. The opening 804 is arranged in the third bottom wall 801c. Further, an opening 805a is arranged in the fourth bottom wall 801d for exposure of the USB connection part 501 of the USB board 5 to the exterior of the outer shell 8. Further, in a section of the fourth bottom wall 801d corresponding to the light emitting parts 401 of the display board 4, window parts 805b are arranged for transmitting to the exterior of the outer shell 8 the light emitted from the light emitting parts 401. In the section where the window parts 805b are arranged in the fourth bottom wall 801d, a display print member 805c is attached and is printed with a row of characters (not illustrated) for providing notification to the user of the meaning indicated by the lighting state of each light emitting part 401. In sections corresponding to each of the window parts 805b, holes are arranged in the display print member 805c for emitting to the exterior of the outer shell 8 light from the light emitting parts 401 passing through the window part 805b.

Figure 8:
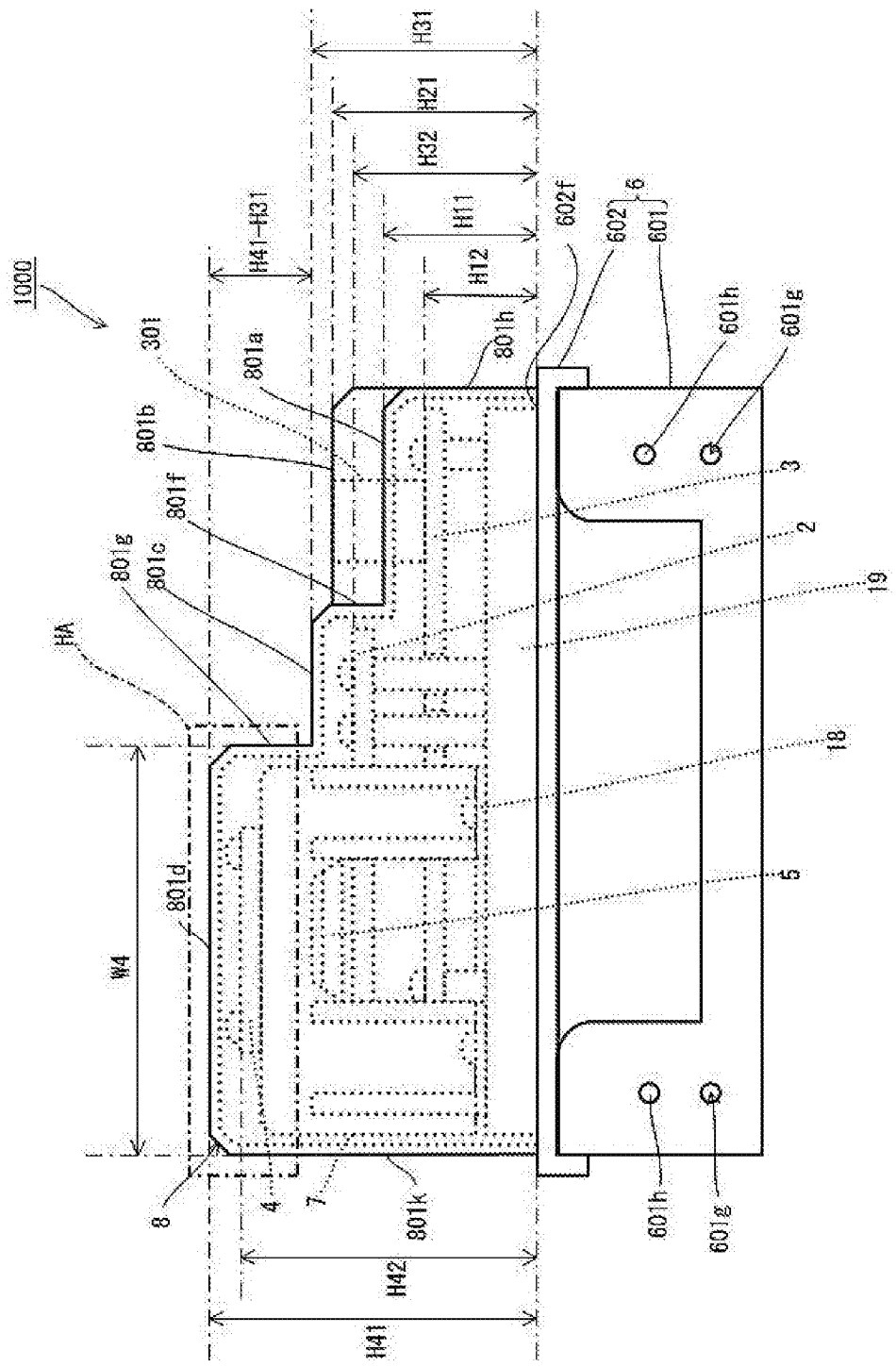
FIG. 8 is a side view of the controller according to the embodiment.

As illustrated in FIG. 8, the dimensions of the outer shell 8 are set to match the layout of the control board 2, the transmitting board 3, the insulating member 18, the holding member 7, and the like enclosed in the outer shell 8. Further, the power supply board 1 is not illustrated in FIG. 8. Further, in the description below, the direction from the housing 6 toward the outer shell 8 in the thickness direction of the housing 6 is taken to be the forward direction, and the term "height" is taken to mean height from a front surface 602f of the lid part 602. The difference between a height H11 of the first bottom wall 801a and a height H12 of the transmitting board 3 (H11-H12), for example, is set to a size such that the electronic components disposed on the transmitting board 3 do not contact the first bottom wall 801a. A height H21 of the second bottom wall 801b is roughly equal to height of the distal tip surfaces of the modular jacks 301. The difference between a height H31 of the third bottom wall 801c and a height H32 of the control board 2 (H31-H32), for example, is set to a size such that the electronic components disposed on the control board 2 do not contact the third bottom wall 801c. The difference between a height H41 of the fourth bottom wall 801d and a height H42 of the display board 4 (H41-H42) is set to a size such that at least the light emitted from the light emitting parts 401 of the display board 4 is capable of efficient emission to the exterior of the outer shell 8. Further, a height of the fourth bottom wall 801d is roughly equivalent to a height of the distal tip surface of the USB connection part 501 (see FIG. 1).

Further, a maximum width W4 in the direction of lining up of the third bottom wall 801c and the fourth bottom wall 801d of the fourth bottom wall 801d forming a portion of the gripping part HA is set to a size such that the user is able to use a single hand to grasp the outer shell 8. That is to say, the maximum width W4 is set while taking into account the size of the hand of a general user. Further, the front-back direction length of the sidewall 801g forming a portion of the gripping part HA, that is to say, the step difference between the third bottom wall 801c and the fourth bottom wall 801d (H41-H31) can be set while taking into account ease of gripping by the user. The size of this step difference (H41-H31) can be set to various values while setting the distance between the fourth bottom wall 801d and the display board 4 to a fixed size. For example, in the case in which the size of the step difference (H41-H31) is to be set large, the holding member 7 may be designed to increase the distance between the display board 4 and the control board 2. Further, when the maximum width W4 of the fourth bottom wall 801d is set to a length (for example, less than or equal to 120 mm) within the linear distance between the first joint of the thumb and the first joint of the middle finger of the hand of a typical person when the hand is spread in a relaxed manner, and when the front-back direction length of the sidewall 801g (step difference H41-H31) is set to a length (for example, greater than or equal to 15 mm) of at least one half of the length from the tips of each finger to the first joint of the hand, the thumb of one hand can be applied to either the sidewall 801g or the sidewall 801k, and the outer shell 8 can be grasped by applying a finger other than the thumb in one additional direction.

Method of Attachment of the Controller

Figure 9:
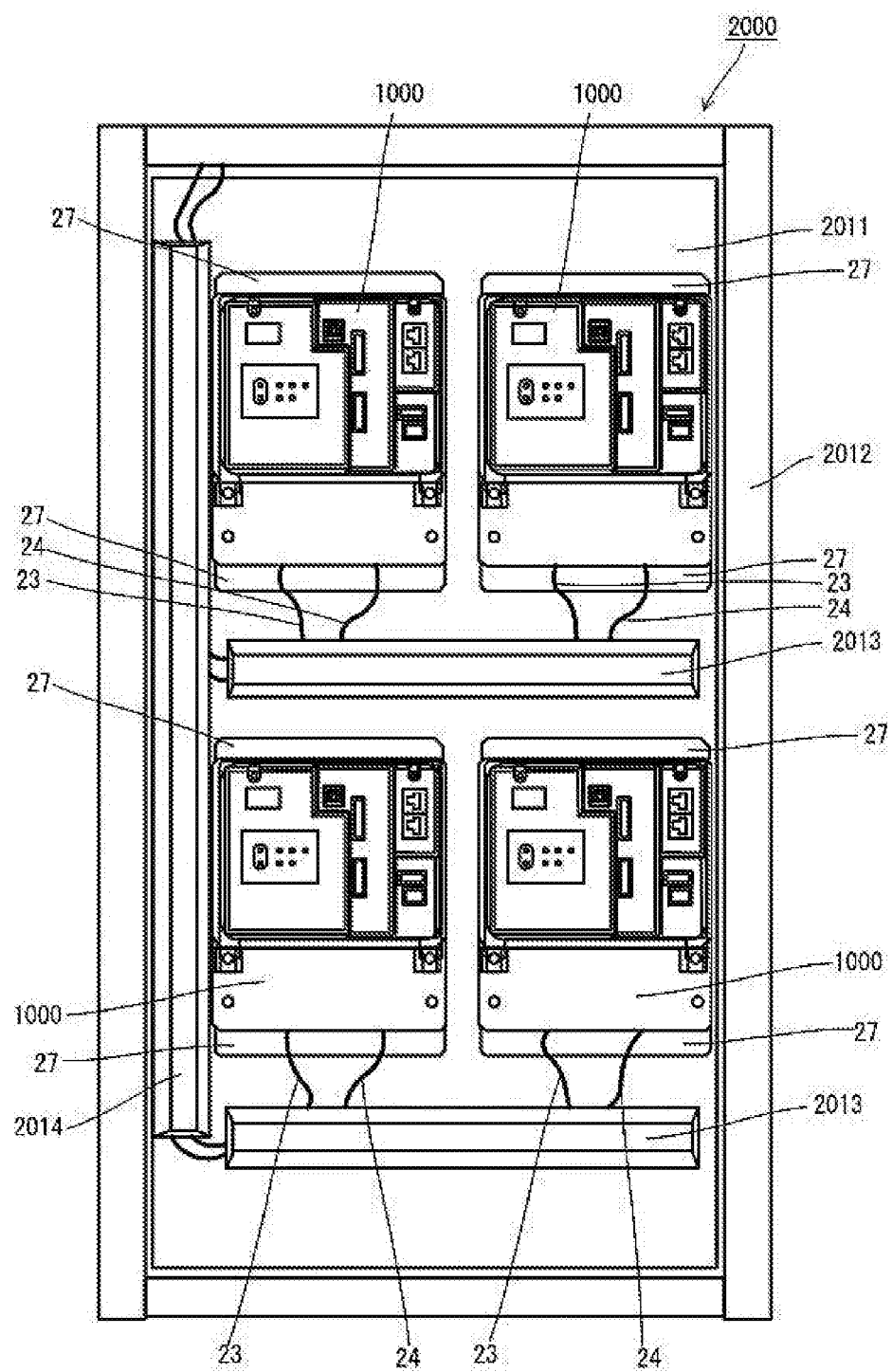
FIG. 9 is a front view of a control unit with the controller according to the present embodiment attached.

The method of attachment of the controller 1000 according to the present embodiment is described next. The controllers 1000 are attached to a control panel 2011 of a control unit 2000 as illustrated in FIG. 9, for example. Further, the control panel 2011 is enclosed within a main body 2012. The power supply cable 23 and the transmitting cable 24 led from each of the controllers 1000 are routed through pipes 2013 and 2014 provided for the control panel 2011.

Figure 10:
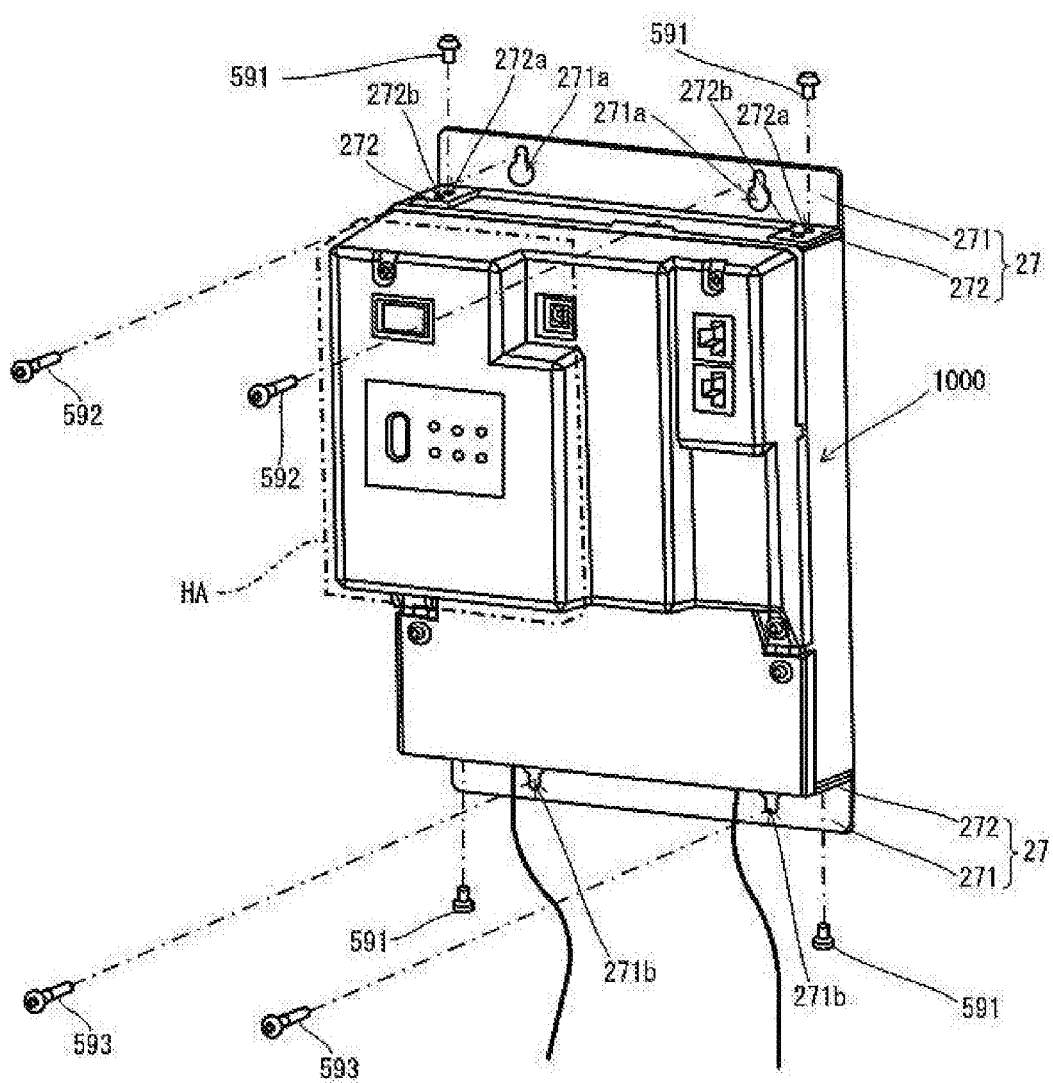
FIG. 10 is a drawing illustrating a method of attachment of the controller to a control panel of the control unit according to the embodiment.

The controller 1000 is attached to the control panel 2011 by the two attaching members 27. As illustrated in FIG. 10, the attachment member 27 is provided with a narrow lengthwise-extending rectangular main piece 271 and rising pieces 272 that each rise in a direction roughly orthogonal to the main piece 271 from each end portion in the main piece 271 lengthwise direction and that each continue to one transverse direction edge side of the main piece 271. Two keyhole slots 271a are bored in the main piece 271. Two through holes 272a and 272b are arranged in each of the rising pieces 272.

Firstly, as illustrated in FIG. 10, the controller 1000 is attached to the attaching member 27. Specifically, the projecting parts 601h of the sidewall 601b are fit over the through holes 272b formed in the rinsing piece 272 of the attachment member 27. Then screws 591 inserted into each of the through holes 272a of the rising piece 272 are screwed into the screw holes 601g of the sidewalls 601b and 601e to fix the attaching member 27 to the housing 6.

After screwing of screws 592 into the control panel 2011, the gripping part HA of the outer shell 8 is grasped by one hand, and the keyhole slots 271a of the attaching member 27 attached to the upper side of the controller 1000 are latched onto the screws 592. At this time, after the heads of the screws 592 are inserted into the wide portions of the keyhole slots 271a, the keyhole slots 271a of the attachment member 27 can be hooked onto the screws 592 by movement of the shafts of the screws 592 to the narrow-width portions of the keyhole slots 271a.

Thereafter, screws 593 inserted through the narrow-width portions of the keyhole slots 271b of the attachment member 27 attached by the screws 593 to the bottom side of the controller 1000 are tightened into the control panel 2011.

The controller 1000 is attached to the control panel 2011 by tightening of the screws 593 into the control panel 2011 after hooking the controller 1000 onto the screws 592 screwed into the control panel 2011 in this manner. When the controller 1000 is hooked onto the control panel 2011 in this manner, holding of the controller 1000 by hand is not required, and thus the burden of the attachment operation can be lessened.

Figure 11:
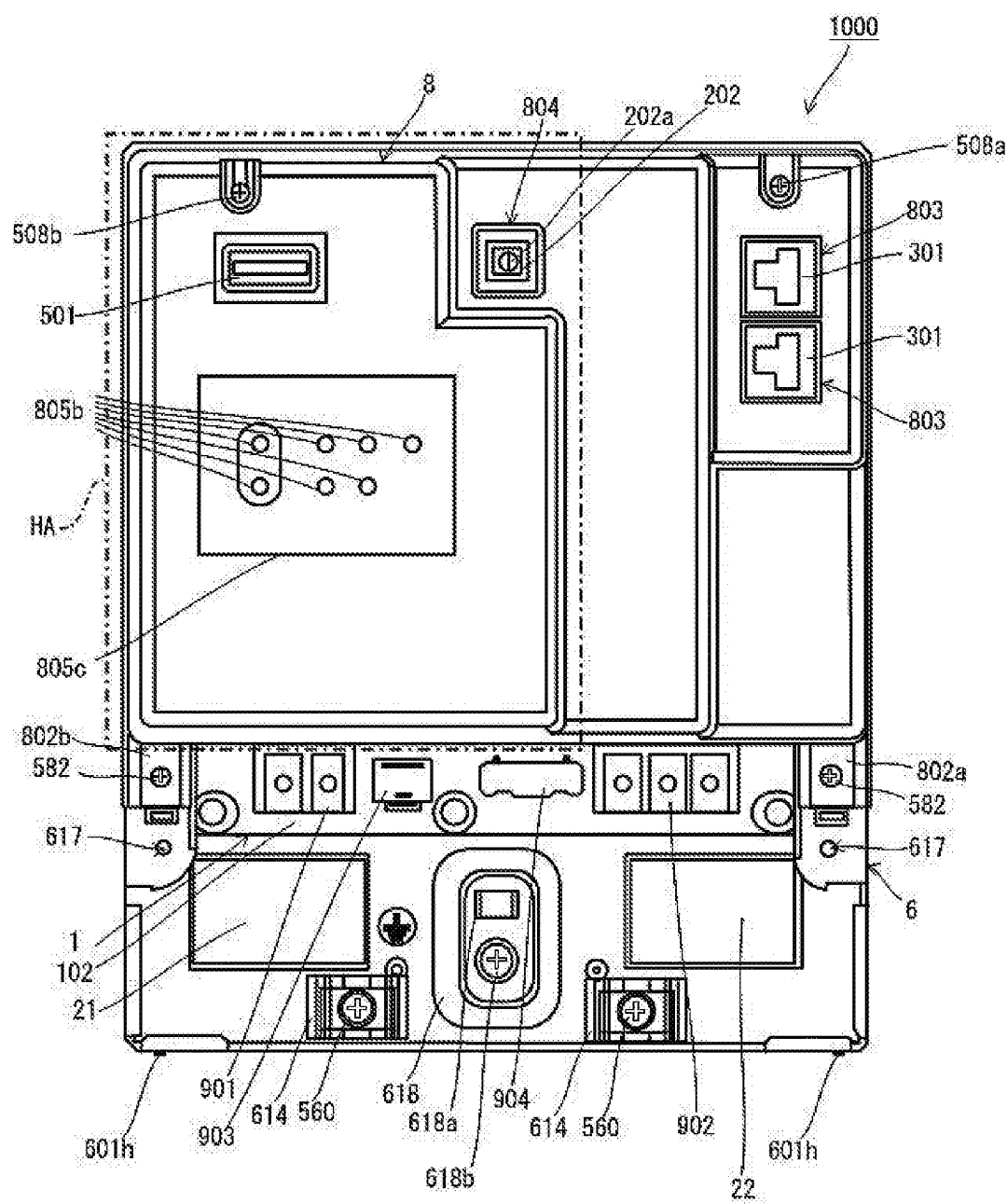
FIG. 11 is a front view illustrating the state in which the lid is removed from the controller according to the embodiment.
Figure 12:
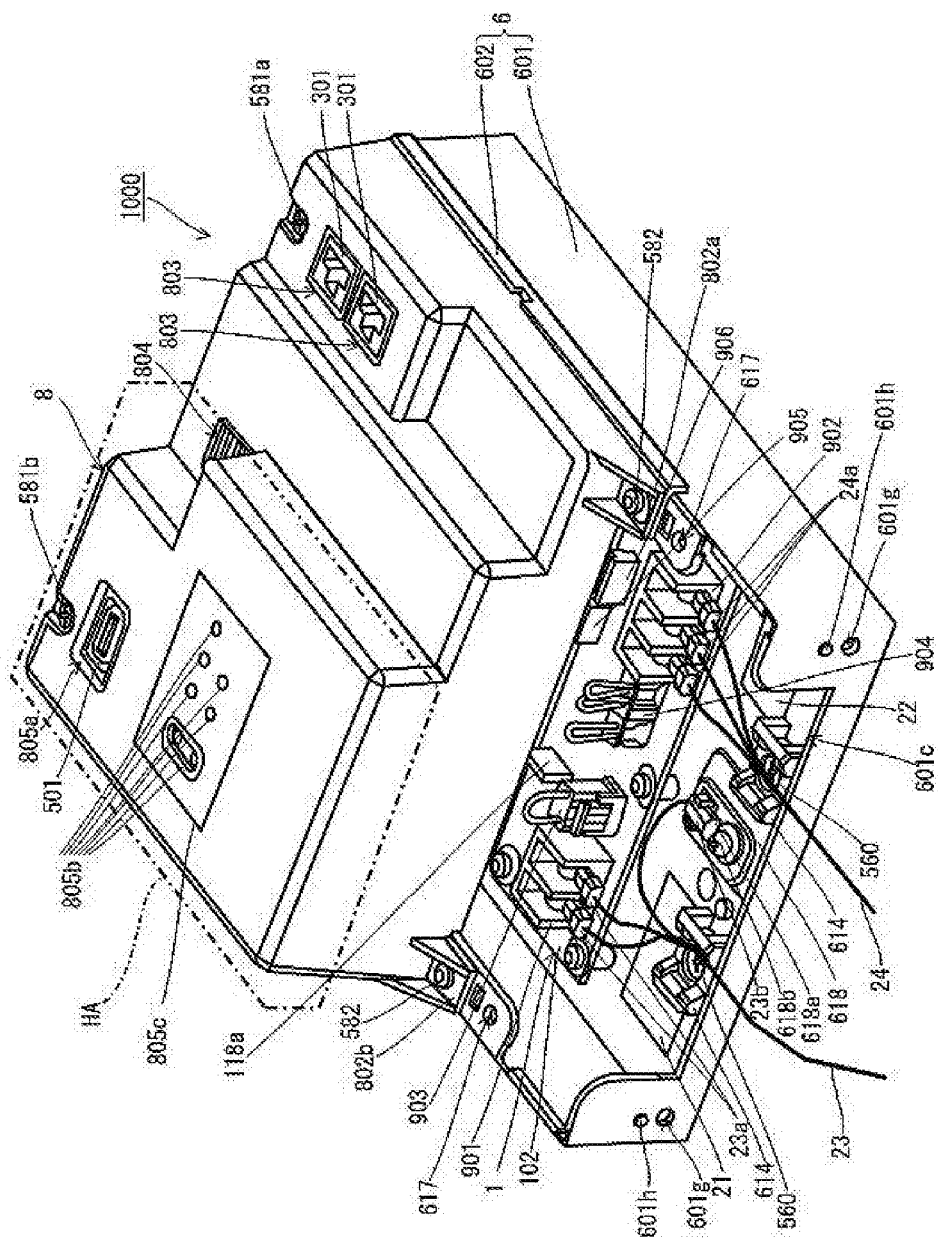
FIG. 12 is a tilted perspective view illustrating a state in which the lid is removed from the controller according to the embodiment, and a power supply cable and a transmitting cable are connected.

Method of Connecting the Power Supply Cable and Transmitting Cable to the Controller Next, the method of attachment the power supply cable 23 and the transmitting cable 24 (see FIG. 1) to the controller 1000 is described in reference to FIG. 11 and FIG. 12. Further, a similar method is used when replacing the power supply cable 23 or the transmitting cable 24 of the controller 1000.

Firstly, the lid 26 is removed from the housing 6. At this time, as illustrated in FIG. 9, the controller 1000 as viewed toward the front face thereof is in a state in which the power supply connecting terminal 901, the transmission connecting terminal 902, the connector 903 for inspection, the connector 904 for servicing, and the grounding terminal base 618 are visible. Further, the display label 21 indicating the connection targets of a power supply plug 23a and the grounding plug 23b (see FIG. 12) of the power supply cable 23, and the display label 22 indicating the connection targets of a transmitting plugs 24a of the transmitting cable 24, are in a state that enables visual checking.

Next, as illustrated in FIG. 12, the power supply plugs 23a of the power supply cable 23 are connected to the power supply connecting terminals 901. Further, after sandwiching of the grounding plug 23b of the power supply cable 23 by the sandwiching part 618a, the grounding plug 23b and the grounding terminal base 618 are electrically connected by the screw 618b. Further, the transmitting plug 24a of the transmitting cable 24 is connected to the transmission connecting terminal 902. At this time, the user performing the operation of attaching the power supply cable 23 and the transmitting cable 24, while referring to the display labels 21 and 22, is able to perform the connection operation of connecting the power supply cable 23 to the power supply connecting terminals 901, as well as to perform the connection operation of connecting the transmitting cable 24 to the transmission connecting terminals 902.

Thereafter, the two power supply cables 23 that are each connected to a respective plug of the two power supply plugs 23a, and the single power supply cable 23 that is connected to the grounding plug 23b, are bundled by a bundling member (not illustrated) in a state which sets the cables on the fixing base 614. Further, the three transmitting cables 24 that are each connected to a respective plug of the three transmitting plugs 24a are bundled by a bundling member (not illustrated) in a state which sets the cables on the fixing base 614. Thereafter, the lid 26 is attached to the housing 6.

Maintenance Operation and the Like of the Controller

An example of maintenance operation and the like of the controller 1000 is described next. An operation to adjust the control board 2 by operation of the switch 202 of the control board 2 by the user is presented as an example. Here, the user, for example, connects a personal computer via a plug (not illustrated) of a LAN cable to the modular jack 301, and operates the switch 202 and adjusts the control board 2 while using the personal computer to check various information output from the controller 1000. Alternatively, while the user checks the lighting state of the LAN cable light emitting part 401, the user inputs from the personal computer setting information to the control board 2, and updates the setting information of the control board 2. Alternatively, the user connects the controller 1000 to the personal computer via the USB connection part 501, for example, and while using the personal computer to check various information output from the controller 1000, operates the switch 202. Alternatively, while checking the lighting state of the light emitting part 401, the user operates the switch 202 and adjusts the control board 2.

As another example, an operation may be cited on inspection of the operation of the power supply board 1 during a product inspection step. Here, an inspection operator removes the lid 26 from the housing 6, connects a probe (not illustrated) of an inspection device (not illustrated) to the connector 903 for inspection, and performs the inspection. The inspection operator determines whether the power supply board 1 is good or defective on the basis of an inspection result received as a notification from the inspection device. As a yet further example, an operation can be cited of, after circulation of the controller 1000 in the marketplace, the operation of the power supply board 1 in a periodic inspection of the controller 1000 by a service person and the like. In this case, after removing the lid 26 from the housing 6, the service person connects the probe of the inspection device to the connector 904 for servicing, and performs the inspection. The service person determines whether the power supply board 1 is good or defective on the basis of an inspection result received as a notification from the inspection device.

In the aforementioned manner, each of the maintenance operations can be performed without removal of the control board 2 from within the outer shell 8, and without removing the power supply board 1 from within the housing 6.

In the controller 1000 according to the present embodiment in the aforementioned manner, the transmitting board 3 is disposed such that the surface on which the modular jacks 301 are arranged faces the control board 2, and such that the modular jacks 301 are not covered by the control board 2. By this means, the plugs can be attached to and detached from the modular jacks 301 from the exterior while leaving the transmitting board 3 in place. Further, the surface of the control board 2 on which the switch 202 is arranged faces the display board 4 and the USB board 5, and the control board 2 is disposed such that the switch 202 is not covered by the display board 4 and the USB board 5. By this means, the operation part 202a of the switch 202 can be operated from the exterior while leaving the control board 2 positioned as is. Thus the operations of changing the placement of the transmitting board 3 and the control board 2 are not required during operations such as plugging and unplugging into the modular jacks 301 and operating the operation part 202a of the switch 202. The operations such as plugging and unplugging into the modular jacks 301 and operating the operation part 202a of the switch 202 can be more easily accomplished to a corresponding degree, and thus the operation of maintenance of the controller 1000 can be made more efficient.

Further, in the controller 1000 according to the present embodiment, the control board 2 and the transmitting board 3 are disposed in a form that overlaps in the thickness direction of the control board 2. Further, the display board 4 and the USB board 5 are disposed in a form that overlaps with the control board 2 in the control board 2 thickness direction, and thus in comparison to a configuration that disposes the control board 2, the transmitting board 3, the display board 4, and the USB board 5 two-dimensionally, for example, the controller 1000 can be miniaturized, and thus the degrees of freedom of the installation location can be increased. For example, a greater number of the controllers 1000 can be arranged in a limited space such as that of the control panel 2011 of the control unit 2000.

For the housing 6 according to the present embodiment, the outer shell 8 is attached to the outside of the housing 6, and the lid 26 is detachably attached to the housing 6. Further, the sections where the power supply connecting terminal 901, the transmission connecting terminal 902, the connector 903 for inspection, and the connector 904 for servicing are disposed on the terminal board 102 at locations corresponding to the lid 26 within the housing 6. Further, the power supply connecting terminal 901, the transmission connecting terminal 902, the connector 903 for inspection, and the connector 904 for servicing can be accessed from the exterior of the housing 6 while in the state in which the lid 26 is removed. Thus by merely removing the lid 26 in the state in which the controller 1000 is installed, the user can perform the operations of wiring the power supply cable 23 to the power supply connecting terminals 901 and the transmitting cables 24 to the transmission connecting terminals 902. Thus the wiring operation can be accomplished efficiently. As illustrated in FIG. 11, the power supply connecting terminal 901 and the transmission connecting terminal 902 can be visually checked when the controller 1000 is viewed from the front of the controller 1000 in the state in which the lid 26 is removed. Thus from the front face of the controller 1000, the user can easily perform the operations of wiring the power supply cable 23 to the power supply connecting terminals 901 and the transmitting cable 24 to the transmission connecting terminals 902. Further, during the operations to wire the power supply cable 23 to the power supply connecting terminals 901 and the transmitting cable 24 to the transmission connecting terminals 902, pulling of the power supply board 1 out to the exterior of the housing 6 is not required, and thus there is no requirement for the securing of space at the side of the controller 1000 in order to pull out the power supply board 1. Thus a greater number of controllers 1000 can be installed in a limited space such as that of the control panel 2011 of the control unit 2000, for example.

A relatively high current flows in the power supply board 1. Thus when an eddy current flows in the power supply board 1, for example, a fire may occur in the power supply board 1 (see F of FIG. 5). In contrast, in the controller 1000 according to the present embodiment, the housing 6 and the lid 26 are formed from materials that are resistant to fire. Further, due to covering of the power supply board 1 by the housing 6 and the lid 26, the housing 6 and the lid 26 function as a fire-preventing enclosure that prevents movement of a flame from the power supply board 1 to the control board 2 or the transmitting board 3 when fire occurs on the power supply board 1. This configuration enables the prevention of the control board 2 or the transmitting board 3 from receiving damage due to the occurrence of a fire on the power supply board 1, and thus this configuration is advantageous in that protection of the control board 2 and the transmitting board 3 can be increased.

Further, a portion of the outer shell 8 according to the present embodiment has the gripping part HA. By this means, due to the user being able to grasp with a single hand the gripping part HA of the outer shell 8 during attachment of the controller 1000 to the control panel 2011 and the like, for example, the operation of installing the controller 1000 can be made easier. Further, due to the ability to perform the operation of attachment to the control panel 2011 while grasping the gripping part HA by a single hand, the installation operation can be performed by a single person, and the number of personnel required for wiring work or for the installation of the controller 1000 can be reduced. Further, the display board 4 and the USB board 5 are arranged to the inside of the gripping part HA of the outer shell 8. By such arrangement, in addition to the gripping part HA serving as a section for simply being grasped by the user, the gripping part HA also functions as a section that contains the display board 4 and the USB board 5. Thus this configuration also has the advantage of enabling effective use of the space within the outer shell 8.

In the case of a controller in which the transmitting board 3 and the control board 2 are arranged at the backside, operations such as connecting plugs to the modular jacks 301 arranged on the transmitting board 3 and fine adjustment of the switch 202 arranged on the control board 2 require performance of such operations from the backside of the controller. In this case, when the controller is installed in a state in which the backside of the controller contacts the control panel 2011, work must be performed such as removing the controller from the control panel 2011 and then connecting the plugs and the like, and the efficiency of operation may worsen.

In contrast, in the controller 1000 according to the present embodiment, the transmitting board 3 is disposed such that the surface of the transmitting board 3 where the modular jacks 301 are arranged faces the front surface direction. Further, the control board 2 is disposed such that the surface where the switch 202 is arranged faces the front surface direction. The outer shell 8 has the opening 803 arranged in the sections that overlap with the modular jacks 301 in the thickness direction of the transmitting board 3. Further, the outer shell 8 has the opening 804 arranged at the section that overlaps with the switch 202 in the thickness direction of the control board 2. By this means, the operations of maintaining the controller 1000, such as the operation of connecting plugs to the modular jacks 301 and the operation of adjusting the control board 2 by the switch 202, can be accomplished by the user from the direction of the front surface. Thus the user is not required to remove the controller 1000 from the control panel 2011 during maintenance work, and therefore an increase of efficiency of the maintenance work can be achieved, and the maintenance work time can be reduced.

In the controller 1000 according to the present embodiment, the grounding lines of the control board 2 and the transmitting board 3 are connected electrically to the common grounding member 19, and the grounding line of the power supply board 1 is electrically connected to the housing 6. Further, the grounding member 19 and the housing 6 are electrically insulated from each other by the insulating member 18. By this means, in comparison to the case in which all of the grounding lines of the power supply board 1, the control board 2, and the transmitting board 3 are electrically connected to the common grounding member 19 and the housing 6, interference in the control board 2 or the transmitting board 3 can be prevented between the current flowing through the grounding line of the power supply board 1 and the current flowing through the grounding lines of the control board 2 and the transmitting board 3.

Although embodiments of the present disclosure are described above, the present disclosure is not limited to the embodiments.

In the present embodiment, an example is described in which, as viewed in the direction of overlapping between the control board 2 and the transmitting board 3, the switch 202 and the modular jacks 301 are disposed at one direction side of the display board 4 and perpendicular to the direction of lining up of the display board 4 and the USB board 5. However, the arrangement of the switch 202 and the modular jacks 301 is not limited to this configuration.

Figure 13:
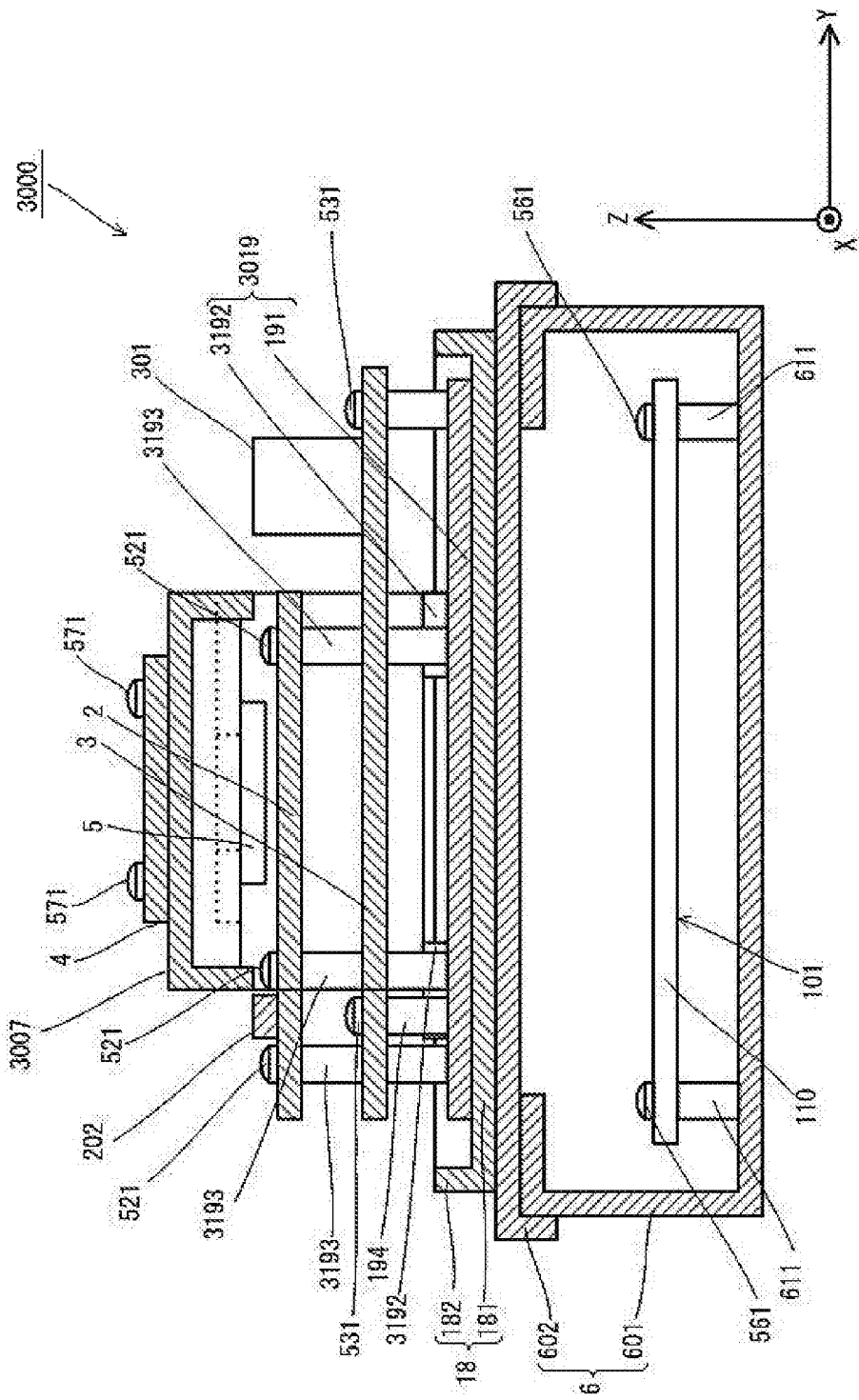
FIG. 13 is a cross-sectional drawing of a controller according to a modified variation.

For example, as illustrated in FIG. 13, when viewed in the direction of overlapping of the control board 2 and the transmitting board 3, a controller 3000 may have the switch 202 and the modular jacks 301 disposed on respective sides of the display board 4 in the direction (Y direction in FIG. 13) and perpendicular to the direction of lining up of the display board 4 and the USB board 5. In this case, the control board 2, the transmitting board 3, the display board 4, and the USB board 5 are disposed such that step differences arise on both sides of the display board 4. Further, the control board 2 is connected to a grounding member 3019 via a first connection part 3193. A holding member 3007 holds the display board 4 and the USB board 5 so as not to cover the switch 202 of the control board 2. A fixing piece 3192 of the grounding member 3019 is arranged at a position corresponding to arrangement of the holding member 3007.

Figure 14:
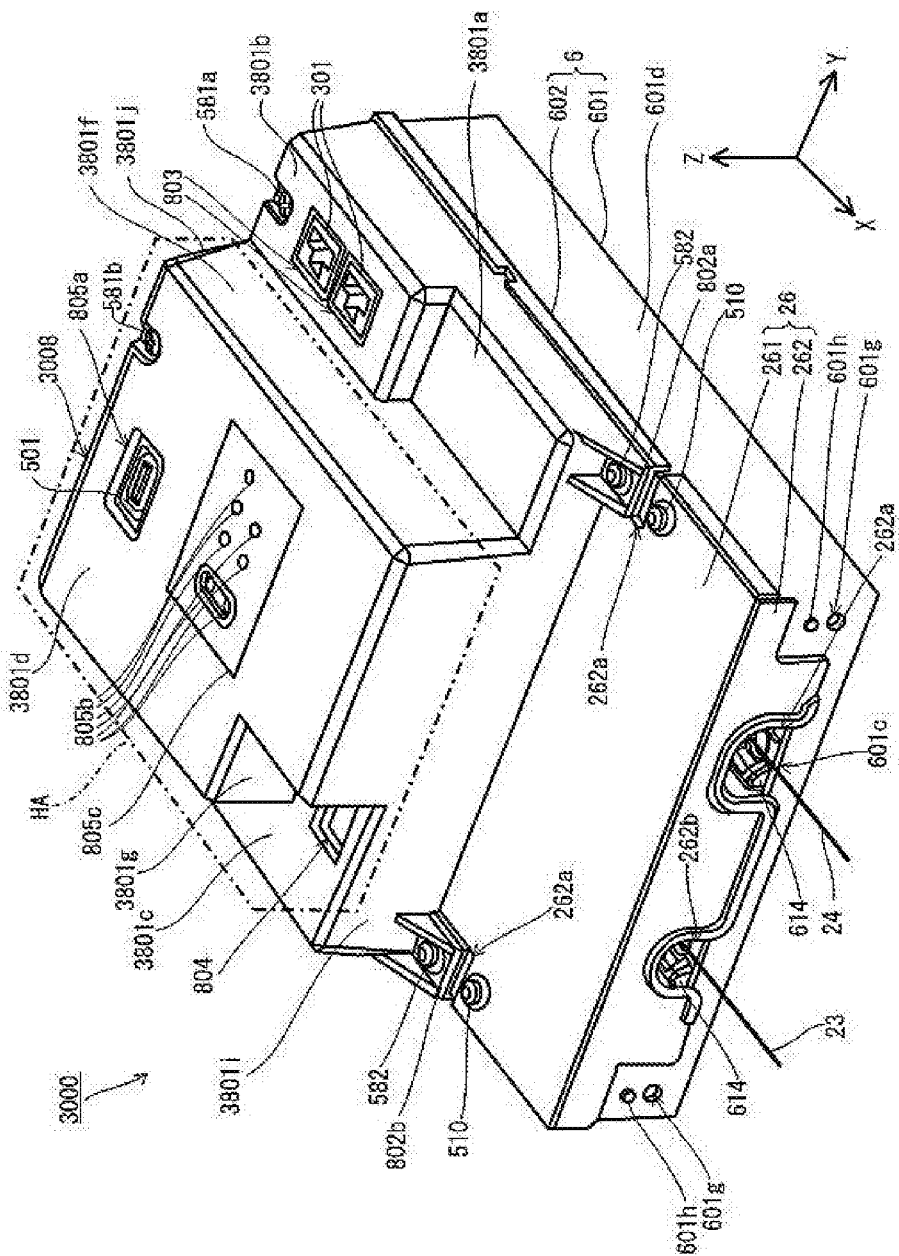
FIG. 14 is a titled perspective view of the controller according to the modified variation.

As illustrated in FIG. 14, reflecting the aforementioned arrangement of the control board 2, the transmitting board 3, the display board 4, and the USB board 5, the outer shell 8 has a shape that has step differences in the sections corresponding to both sides of the display board 4. Further, in FIG. 14, structures that are the same as the structures of the embodiment are assigned the same reference symbols as the reference symbols of FIG. 7. A second bottom wall 3801*b* is separated further than a first bottom wall 3801*a* in the direction (+Z direction within FIG. 14) from the opening face. A third bottom wall 3801*c* is separated further than the second bottom wall 3801*b* in the direction (+Z direction within FIG. 14) from the opening face. A fourth bottom wall 3801*d* is separated further than the third bottom wall 3801*c* in the direction (+Z direction within FIG. 14) from the opening face.

When viewed from the thickness direction (+Z direction in FIG. 14) of the first bottom wall 3801*a*, the first bottom wall 3801*a* and the second bottom wall 3801*b* are arranged adjacent to each other. The fourth bottom wall 3801*d* is arranged adjacent to the first bottom wall 3801*a* and the second bottom wall 3801*b* in the direction (Y direction in FIG. 14) perpendicular to the direction of lining up of the first bottom wall 3801*a* and the second bottom wall 3801*b*. The third bottom wall 3801*c* is arranged adjacent to the fourth bottom wall 3801*d* and the side thereof that is opposite to the first bottom wall 3801*a* and the second bottom wall 3801*b*. The gripping part HA is formed from the fourth bottom wall 3801*d* and sections adjacent to each of a sidewall 3801*f*, and sidewalls 3801*g*, 3801*i*, and 3801*j* near the fourth bottom wall 3801*d* in the outer shell 8.

According to the present configuration, even when the controller 1000 is installed in a location that does not enable the securing of space in the vicinity of the modular jacks 301, the switch 202 is arranged at a position separated from the modular jacks 301, and thus the switch 202 can be easily adjusted.

Although an example is described in the embodiment in which the control board 2, the transmitting board 3, and the display board 4 are arranged so that the three boards partially overlap each other on the housing 6, the number of overlapping boards that overlap on the housing 6 is not limited to three boards. The number of overlapping boards may be two or less, or may be four or more.

Figure 15:
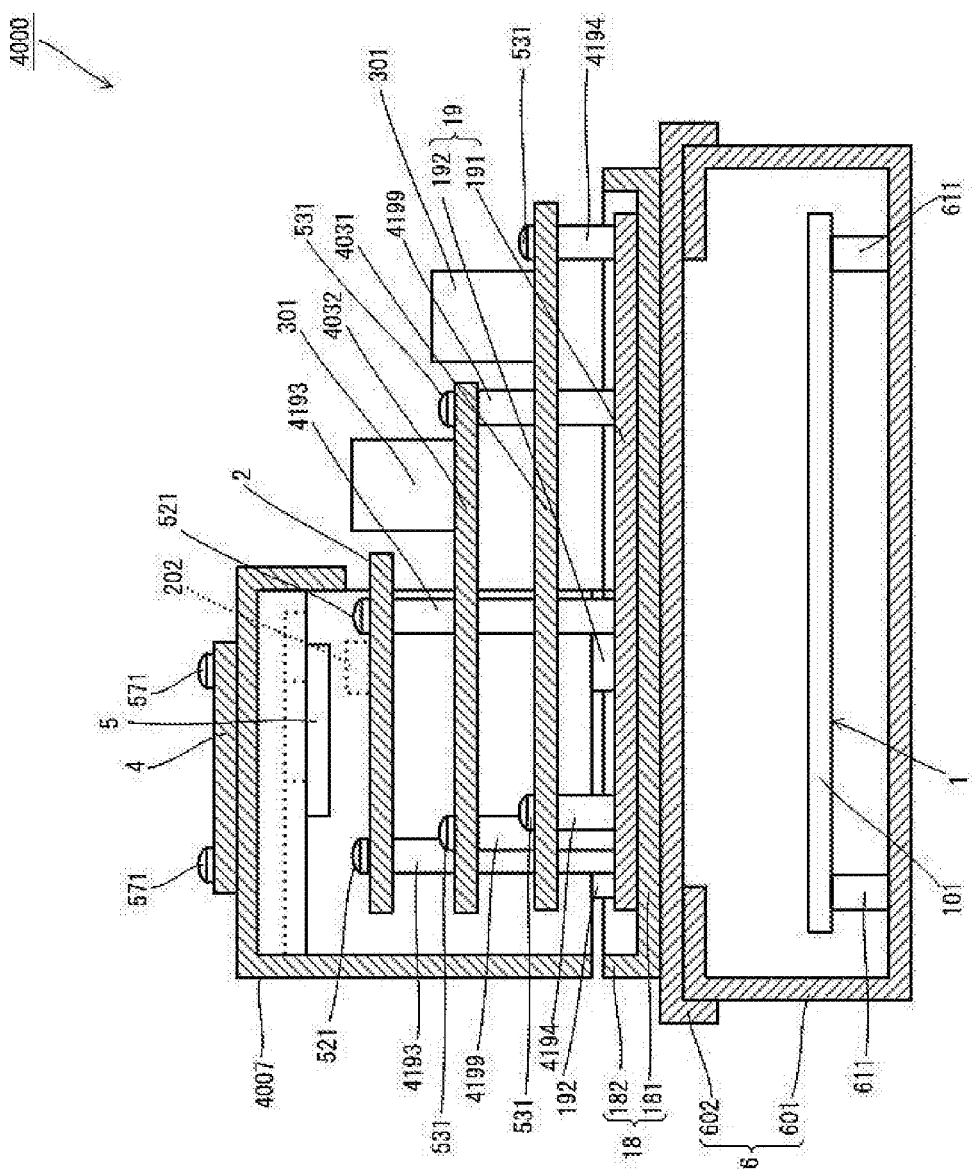
FIG. 15 is a cross-sectional drawing of the controller of the modified variation.

For example, as illustrated in FIG. 15, two transmitting boards 4031 and 4032 may be provided and may be disposed such that portions of the two transmitting boards 4031 and 4032 overlap each other. The transmitting board 4031 is connected to the grounding member 19 by a second connection part 4194, and the transmitting board 4032 is grounded by a third connection part 4199 to the grounding member 19. Length of the second connection part 4194 is different from length of the third connection part 4199. By this means, the transmitting board 4031 and the transmitting board 4032 are disposed at positions that have mutually different heights from the lid part 602. The transmitting board 4032 is disposed at a position that does not cover the modular jacks 301 of the transmitting board 4031. The display board 4 is held by a holding member 4007. The holding member 4007 holds the display board 4 and the USB board 5 such that heights of the display board 4 and the USB board 5 from the lid part 602 are greater than the heights of the control board 2 and the transmitting boards 4031 and 4032 from the lid part 602.

According to this configuration, decrease of surface area of each of the transmitting boards 4031 and 4032 is enabled by decreasing the scale of the transmission circuits of each of the transmitting boards 4031 and 4032. Thus as viewed from the direction of overlapping of the control board 2 and the transmitting boards 4031 and 4032, size of a controller 4000 can be reduced.

Although in the present embodiment an example is described in which the switch 202 is arranged on only one surface of the control board 2, the position of arrangement of the switch 202 is not limited to just the one surface. For example, switches 202 may be arranged on both surfaces of the control board 2. In this case, as viewed from the thickness direction of the control board 2, sizes of the transmitting board 3 and the housing 6 may be set smaller than size of the control board 2. Further, the switch 202 may be arranged on a section of the control board 2 that is not covered by the transmitting board 3 or the housing 6.

Although in the present embodiment an example is described of arrangement of the display board 4 and the USB board 5 in a region to the interior of the gripping part HA of the outer shell 8, the number of circuit boards arranged in the region interior to the gripping part HA is not limited to two boards. For example, a single circuit board may be arranged alone in the region interior to the gripping part HA. Alternatively, three or more circuit boards may be arranged in an overlapping form as viewed from the thickness direction of the circuit boards.

Although in the present embodiment an example is described of the controller 1000 that includes the outer shell 8, including of the outer shell 8 is not required. For example, when the controller is arranged inside a housing, the controller may have a configuration that exposes the control board 2, the transmitting board 3, the display board 4, and the USB board 5.

Although in the present embodiment a configuration is described in which the transmitting board 3 includes the modular jack 301, the type of the connector included on the transmitting board 3 is not limited to the modular jack 301. For example, the transmitting board 3 may include other types of connectors, such as the USB connection part 501. Alternatively, the transmitting board 3 may include an electronic component, such as a switch, that has an operation part, or may include a display part such as the light emitting part. Further, although in the present embodiment a configuration is described in which the control board 2 includes the switch 202, the control board 2, for example, may have a configuration that includes a connector such as the USB connection part 501, or that includes a display part such as the light emitting part 401.

Although in the present embodiment an example is described in which the fourth bottom wall 801*d* forming a portion of the gripping part HA is roughly rectangular, the shape of the fourth bottom wall 801*d* is not limited to the roughly rectangular plate-like shape. The shape of the fourth bottom wall 801*d* may be made circular or elliptical, for example, by appropriate revision of the placement of the display board 4 and the USB board 5.

In the present embodiment, an example is described in which the holding member 7 has a rib that has the screw hole 705*a* bored therein, the insulating member 18 has a rib that has the screw hole 183*a* bored therein, and the outer shell 8 is fixed to the holding member 7 and the insulating member 18 by the screws 581*b* and 581*a* screwed into the screw holes 705*a* and 183*a*. However, the outer shell 8 is not limited to a configuration that is fixed to the holding member 7 and the insulating member 18. For example, the housing 6 may include a rib that has a screw hole bored into the distal tip thereof, and the outer shell 8 may be fixed to the housing 6 by a screw screwed into the screw hole of the rib.

In the present embodiment, although an example is described of the controller of an air conditioner, the control target of the controller is not limited to an air conditioner, and the control target may be another home device.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

INDUSTRIAL APPLICABILITY

The present disclosure is used with advantage for a device that includes a plurality of circuit boards and has, on at least some of the plurality of circuit boards, a connector for detachable attachment of a plug or an electronic component capable of operation from the exterior of the device.

REFERENCE SIGNS LIST

1 Power supply board
2 Control board
3, 4031, 4032 Transmitting board
4 Display board
5 USB board
6 Housing
7, 3007, 4007 Holding member
8, 3008 Outer shell
18 Insulating member
19, 3019, 4019 Grounding member
21, 22 Display label
23 Power supply cable
23*a* Power supply plug
23*b* Grounding plug
24 Transmitting cable
24*a* Transmitting plug
26 Lid
27 Attaching member
101 Main body board
102 Terminal board
111 Rectifying element
112 Capacitor
113 Isolation transformer
114, 115, 116, 117, 119 Wire harness
114*a* Grounding terminal
117*a* First main body-side connection part
117*b* Second main body-side connection part
118*a* First terminal-side connection part
118*b* Second terminal-side connection part
181, 601*a* Bottom wall
182, 601*b*, 601*d*, 601*e* Sidewall
183, 705 Rib
183*a*, 601*g*, 616, 617, 705*a* Screw hole
191, 261, 271 Main piece
192, 3192 Fixing piece
193, 3193 First connection part
194, 4194 Second connection part
201 Microcomputer
202 Switch
202*a* Operation part
203, 302 Power receiving part
261, 602*a* Main piece
261*a*, 262*a*, 262*b*, 601*c*, 602*c* Cutout part
262, 602*b* Side piece
271*a*, 271*b* Keyhole slot
272 Rising piece
272*a*, 272*b*, 621 Through hole
301 Modular jack
303 Transmitting part
403 Receiving part
501 USB connection part
510, 521, 531, 550, 560, 561, 562, 571, 581*a*, 581*b*, 582, 591, 592, 593, 618*b* Screw
601 Main body part
601*f* Extending piece
601*h* Projecting part
602 Lid part
602*f* Front surface
603, 613 Bundling member
611 Spacer
612 Projecting base part 614 Fixing base
618 Grounding terminal base
618a Sandwiching part
622 Hole
701 First section
701a Attachment surface
702 Second section
702a, 805b Window part
703 Supporting part
801a, 3801a First bottom wall
703a Fixing piece
801b, 3801b Second bottom wall
801c, 3801c Third bottom wall
801d, 3801d Fourth bottom wall
801g, 801i, 801j, 801k, 3801f, 3801g, 3801i, 3801j Sidewall
802a, 802b Tongue part
803, 804, 805a Opening
805c Display print member
901 Power supply connecting terminal
902 Transmission connecting terminal
903 Connector for inspection
904 Connector for servicing
905 First supplying terminal
906 Second supplying terminal
1000, 3000, 4000 Controller
2000 Control unit
2011 Control panel
2012 Main body
2013, 2014 Pipe
4199 Third connection part
HA Gripping part

The invention claimed is:

1. A controller comprising:
a power supply circuit board comprising a ground line, an external connection terminal including a connection terminal and a power supply connecting terminal to which power is supplied from an outside of the controller, the power supply connecting terminal directly connects to a power supply cable to provide power internally, and a power supply circuit to convert AC power supplied from the power supply connecting terminal to DC power;
a housing enclosing the power supply circuit board and electrically connected to the ground line of the power supply circuit board, the housing including a bottom, a fixed lid, and a continuous sidewall with a top peripheral edge, the continuous sidewall extending from the bottom of the housing, an interior of the housing comprising a first part and a second part that connect to each other, the external connection terminal of the power supply being arranged in the second part, the fixed lid covering the first part of the interior of the housing;
a detachably attached lid that covers the second part of the interior of the housing and that is located adjacent to the fixed lid to enclose the housing,
a circuit board comprising a ground line and disposed exterior to, and above, the fixed lid of the housing, the circuit board electrically connected to the power supply circuit board to receive DC power from the power supply circuit board;
a grounding member comprising an electrically conductive material and electrically connected to the ground line of the circuit board, the grounding member contacting the circuit board without contacting the power supply circuit board; and
an insulating member comprising a bottom wall and a sidewall that extends from a periphery of the bottom wall, a first side of the bottom wall contacts the grounding member and a second side of the bottom wall contacts the fixed lid of the housing to electrically insulate the grounding member and the housing from each other, wherein
the power supply circuit board includes:
a main body board that includes a rectifying element, a capacitor, and an isolation transformer directly attached to the main body board, and
a terminal board that extends parallel to the main body board and the detachably attached lid and that is positioned in the second part of the interior of the housing such that an edge opposite to the main body board in a transverse direction of the terminal board is accessible from an exterior of the housing when the detachably attached lid is removed; and
the external connection terminals and the power supply connecting terminal are directly attached to the terminal board along the edge of the terminal board such that an upper surface of each of the connection terminal and the power supply terminal of the external connection terminal face the detachably attached lid in a direction of thickness of the bottom of the housing when the detachably attached lid is attached such as to be exposed and accessible from the exterior of the housing when the lid is detached.

2. The controller according to claim 1, wherein
the power supply circuit board is covered by the housing and the detachably attached lid when the detachably attached lid is attached, and
the housing and the detachably attached lid are made of materials that are fire-resistant.

3. The controller according to claim 1, further comprising an outer shell disposed covering the circuit board, wherein
the circuit board comprises on one surface thereof at least one of a connector detachably attachable to a plug from an exterior of the controller, an electronic component comprising an operation part operable from the exterior of the controller, or a display part disposed on a surface of the circuit board and visible from the exterior of the controller, and
the outer shell comprises an opening disposed in a section of the outer shell overlapping the connector, the electronic component, or the display part in a thickness direction of the circuit board.

4. The controller according to claim 3, further comprising at least one circuit board of a plurality of circuit boards, wherein
the plurality of circuit boards includes a circuit board comprising on one surface thereof at least one of a connector detachably attachable to a plug from an exterior of the controller, an electronic component comprising an operation part operable from the exterior of the controller, or a display part disposed on a surface of the circuit board and visible from the exterior of the controller, a section of at least a portion of the surface of the circuit board opposing another circuit board and being disposed at a position of the circuit board such that the connector, the electronic component, or the display part is not covered by the other circuit board in a thickness direction of the circuit board.

5. The controller according to claim 1, further comprising an outer shell disposed covering a plurality of circuit boards, which includes the circuit board, wherein, for the circuit boards comprising on one surface thereof at least one of a connector detachably attachable to the plug from the exterior of the controller, an electronic component comprising an operation part operable from the exterior of the controller, or a display part disposed on a surface of the circuit board and visible from the exterior of the controller, the circuit boards are disposed such that the one surface is facing the same direction, and the outer shell comprises an opening disposed in a section of the outer shell overlapping the connector, the electronic component, or the display part in a thickness direction of each of the plurality of circuit boards.

6. The controller according to claim 2, further comprising an outer shell disposed covering a plurality of circuit boards, which includes the circuit board, wherein, for the circuit boards comprising on one surface thereof at least one of a connector detachably attachable to the plug from the exterior of the controller, an electronic component comprising an operation part operable from the exterior of the controller, or a display part disposed on a surface of the circuit board and visible from the exterior of the controller, the circuit boards are disposed such that the one surface is facing the same direction, and the outer shell comprises an opening disposed in a section of the outer shell overlapping the connector, the electronic component, or the display part in a thickness direction of each of the plurality of circuit boards.

7. The controller according to claim 5, further comprising at least one circuit board of a plurality of circuit boards, wherein the plurality of circuit boards includes a circuit board comprising on one surface thereof at least one of the connector detachably attachable to a plug from an exterior of the controller, the electronic component comprising an operation part operable from the exterior of the controller, or a display part disposed on the surface of the circuit board and visible from the exterior of the controller, a section of at least a portion of the surface of the circuit board opposing another circuit board and being disposed at a position of the circuit board such that the connector, the electronic component, or the display part is not covered by the other circuit board in a thickness direction of the circuit board.

8. The controller according to claim 6, further comprising at least one circuit board of a plurality of circuit boards, wherein the plurality of circuit boards includes a circuit board comprising on one surface thereof at least one of the connector detachably attachable to a plug from an exterior of the controller, the electronic component comprising an operation part operable from the exterior of the controller, or a display part disposed on the surface of the circuit board and visible from the exterior of the controller, a section of at least a portion of the surface of the circuit board opposing another circuit board and being disposed at a position of the circuit board such that the connector, the electronic component, or the display part is not covered by the other circuit board in a thickness direction of the circuit board.

9. The controller according to claim 7, wherein dimensions of the outer shell match positions of the plurality of circuit boards contained within the outer shell, the outer shell further comprises on a portion of the outer shell a gripping part for gripping by a user, and at least one of the plurality of circuit boards is disposed interior to the gripping part.

10. The controller according to claim 8, wherein dimensions of the outer shell match positions of the plurality of circuit boards contained within the outer shell, the outer shell further comprises on a portion of the outer shell a gripping part for gripping by a user, and at least one of the plurality of circuit boards is disposed interior to the gripping part.

11. The controller according to claim 1, wherein the circuit board is disposed at a position opposing at least a portion of the power supply circuit board in a thickness direction of the power supply circuit board.

12. The controller according to claim 2, wherein the circuit board is disposed at a position opposing at least a portion of the power supply circuit board in a thickness direction of the power supply circuit board.

13. The controller of claim 1, further comprising:

an outer shell that is disposed exterior to, and above, the housing, the fixed lid, and the detachably attached lid and that encloses the circuit board without covering the detachably attached lid.

* * * * *